United States Patent
Hussain et al.

(10) Patent No.: US 7,656,326 B2
(45) Date of Patent: Feb. 2, 2010

(54) DECODING OF CONTEXT ADAPTIVE BINARY ARITHMETIC CODES IN COMPUTATIONAL CORE OF PROGRAMMABLE GRAPHICS PROCESSING UNIT

(75) Inventors: Zahid Hussain, Ascot (GB); Huy Duc Bui, San Jose, CA (US)

(73) Assignee: Via Technologies, Inc., Hsin-Tien, Taipei (TW)

( * ) Notice: Subject to any disclaimer, the term of this patent is extended or adjusted under 35 U.S.C. 154(b) by 6 days.

(21) Appl. No.: 11/759,431

(22) Filed: Jun. 7, 2007

(65) Prior Publication Data

US 2007/0285286 A1    Dec. 13, 2007

Related U.S. Application Data

(60) Provisional application No. 60/811,821, filed on Jun. 8, 2006.

(51) Int. Cl.
H03M 7/00    (2006.01)

(52) U.S. Cl. ...................... 341/107; 375/240

(58) Field of Classification Search ............... 341/107, 341/50, 51; 375/240; 345/204
See application file for complete search history.

(56) References Cited

U.S. PATENT DOCUMENTS

| | | | |
|---|---|---|---|
| 6,628,302 | B2 | 9/2003 | White et al. |
| 6,646,578 | B1 | 11/2003 | Au |
| 6,876,317 | B2 | 4/2005 | Sankaran |
| 2004/0101056 | A1 | 5/2004 | Wong et al. |
| 2005/0062746 | A1* | 3/2005 | Kataoka et al. ............. 345/505 |
| 2005/0117655 | A1 | 6/2005 | Ju |
| 2005/0135691 | A1 | 6/2005 | Reese |
| 2005/0156761 | A1 | 7/2005 | Oh |
| 2005/0249289 | A1 | 11/2005 | Yagasaki et al. |
| 2005/0259747 | A1 | 11/2005 | Schumann |
| 2006/0126744 | A1 | 6/2006 | Peng et al. |
| 2006/0133512 | A1 | 6/2006 | Park |
| 2007/0025441 | A1* | 2/2007 | Ugur et al. ............. 375/240.03 |
| 2007/0040819 | A1* | 2/2007 | Inazumi ...................... 345/204 |
| 2007/0116128 | A1 | 5/2007 | Evans et al. |
| 2007/0183491 | A1* | 8/2007 | Pearson et al. ............. 375/240 |
| 2007/0285287 | A1* | 12/2007 | Hussain et al. ................ 341/50 |
| 2007/0296613 | A1 | 12/2007 | Hussain et al. |
| 2007/0297501 | A1 | 12/2007 | Hussain et al. |
| 2008/0069241 | A1 | 3/2008 | Kadono et al. |

OTHER PUBLICATIONS

Chung-Hyo Kim, In-Cheol Park, High Speed Decoding of Context-based Adaptive Binary Arithmetic Codes Using Most Probable Symbol Prediction, ISCAS 2006, 2006, pp. 1707-1710, 2006 IEEE.

(Continued)

Primary Examiner—Rexford N Barnie
Assistant Examiner—Joesph Lauture
(74) Attorney, Agent, or Firm—Thomas, Kayden, Horstemeyer & Risley

(57) ABSTRACT

Embodiments of decoding systems and methods are disclosed. One system embodiment, among others, comprises a software programmable core processing unit having a context-adaptive binary arithmetic (CABAC) unit configured to execute a shader, the shader configured to implement CABAC decoding of a video stream and provide a decoded data output.

22 Claims, 12 Drawing Sheets

OTHER PUBLICATIONS

U.S. Appl. No. 11/760,247, filed Jun. 8, 2007, U.S. Publication No. 2007-0297501, as provided above.

Non-Final Office Action filed Jul. 8, 2008 for U.S. Appl. No. 11/760,247, U.S. Publication No. 2007-0297501.

U.S. Appl. No. 11/760,274, filed Jun. 8, 2007, U.S. Publication No. 2007-0296613, as provided above.

Non-Final Office Action filed Jul. 16, 2008 for U.S. Appl. No. 11/760,274, U.S. Publication No. 2007-0296613.

U.S. Appl. No. 11/760,296, filed Jun. 8, 2007, U.S. Publication No. 2007-0285287, as provided above.

Non-Final Office Action filed Jul. 17, 2008 for U.S. Appl. No. 11/760,296, U.S. Publication No. 2007-0285287.

* cited by examiner

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 |  |  |  |  |  |  |  |  |  |  |  |  |
|  |  |  |  |  |  |  |  |  |  |  |  |  |  |  |  |
|  |  |  |  |  |  |  |  |  |  |  |  |  |  |  |  |
|  |  |  |  |  |  |  |  |  |  |  |  |  |  |  |  |
|  |  |  |  |  |  |  |  |  |  |  |  |  |  |  |  |

FIG. 6F

DECODING OF CONTEXT ADAPTIVE BINARY ARITHMETIC CODES IN COMPUTATIONAL CORE OF PROGRAMMABLE GRAPHICS PROCESSING UNIT

CROSS-REFERENCE TO RELATED APPLICATION

This application claims priority to copending U.S. provisional application entitled, "VARIABLE-LENGTH DECODING SYSTEMS AND METHODS," having Ser. No. 60/811,821, filed Jun. 8, 2006, which is entirely incorporated herein by reference.

TECHNICAL FIELD

The present disclosure is generally related to data processing systems, and more particularly, is related to programmable graphics processing systems and methods.

BACKGROUND

Computer graphics is the art and science of generating pictures, images, or other graphical or pictorial information with a computer. Many of the current graphics systems are implemented through the use of a set of interfaces, such as MICROSOFT's Direct3D interface, OpenGL, etc., that offer control of multimedia hardware (e.g., a graphics accelerator or graphics processing unit (GPU)) on a computer running a particular operating system, such as MICROSOFT WINDOWS, among others. The generation of pictures or images is commonly called rendering, and the nuts and bolts of such operations are primarily implemented through a graphics accelerator. Generally, in three-dimensional (3D) computer graphics, geometry that represents surfaces (or volumes) of objects in a scene is translated into pixels (picture elements), stored in a frame buffer, and then displayed on a display device. Each object or group of objects may have specific visual properties related to the appearance of surfaces (materials, reflectance, shape, textures, etc.) which may be defined as a rendering context for the object or group of objects.

Consumer demand for increasing sophistication in controls and features for games and other multimedia products for which computer graphics are used, as well as the desire for more realism in generated images, engenders improvements in processing speed and power. Various standards have been developed to improve the visual quality of generated images while consuming fewer bits. One of these standards, the H.264 specification (also known as the ISO Motion Picture Experts Group (MPEG)-4 part 10), is a high compression digital video codec standard. An H.264 compliant codec can encode video with approximately three times fewer bits than comparable MPEG-2 encoders while retaining similar video quality. The H.264 specification provides for two types of entropy encoding processes, including context-adaptive binary arithmetic coding (CABAC) and context-adaptive variable length coding (CAVLC). With regard to CABAC, CABAC decoding operations are typically sequential in nature, requiring extensive computations to calculate various parameters including range, offset, and context information. Current CABAC decoding architectures can meet some of the demands posed by consumers, but use a somewhat restrictive approach in design.

SUMMARY

Embodiments of context-adaptive binary arithmetic coding (CABAC) decoding systems and methods (herein, also referred to as decoding systems) in a multithreaded parallel computational core of graphics processing unit (GPU) are disclosed. Briefly described, in architecture, one embodiment of the system, among others, comprises a software programmable core processing unit having a context-adaptive binary arithmetic (CABAC) unit configured to execute a shader, the shader configured to implement CABAC decoding of a video stream and provide a decoded data output.

One method embodiment, among others, comprises loading a shader to a programmable core processing unit having a context-adaptive binary arithmetic (CABAC) unit, CABAC decoding a video stream by executing the shader on the CABAC unit, and providing a decoded data output.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of decoding systems and methods can be better understood with reference to the following drawings. The components in the drawings are not necessarily to scale, emphasis instead being placed upon clearly illustrating the principles of the systems and methods. Moreover, in the drawings, like reference numerals designate corresponding parts throughout the several views.

FIG. 6F is a block diagram that illustrates an exemplary macroblock decoding mechanism implemented by the decoding system shown in FIG. 6A.

DETAILED DESCRIPTION

Figure 1:
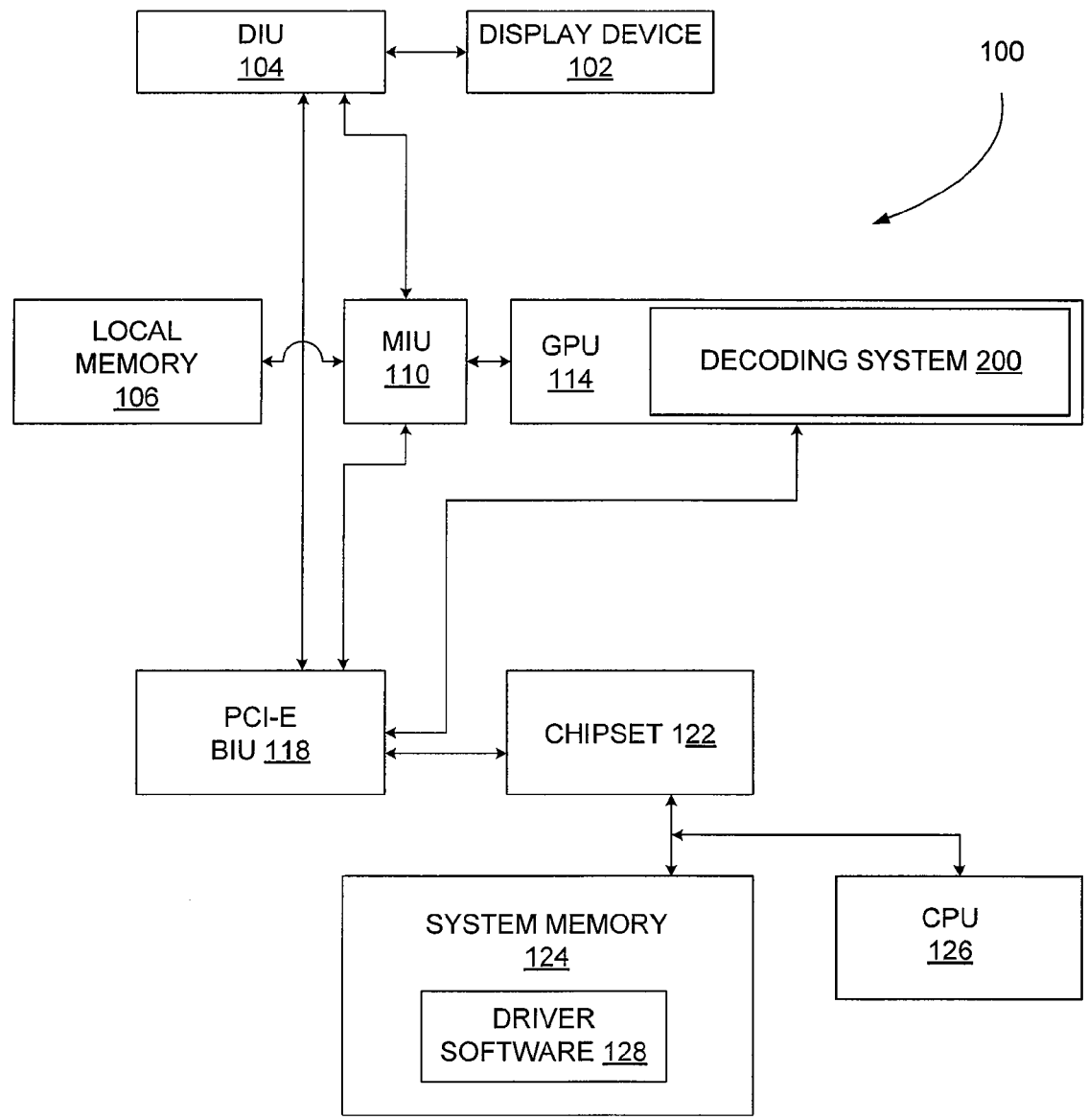
FIG. 1 is a block diagram of an embodiment of a graphics processor system in which various embodiments of decoding systems (and methods) are implemented.

Disclosed herein are various embodiments of context-adaptive binary arithmetic coding (CABAC) decoding systems and methods (herein, also collectively referred to as decoding system(s)). In one embodiment, a decoding system is embedded in one or more execution units of a programmable, multithreaded, parallel computational core of a graphics processing unit (GPU). Decoding functionality is implemented using a combination of software and hardware. That is, video decoding is accomplished within the context of GPU programming, with the hardware implementation in a GPU data path. For instance, in one embodiment, decoding operations or methods are implemented by a shader (e.g., vertex shader) with an extended instruction set in cooperation with an execution unit data path of a GPU and additional hardware for the automatic management of a bitstream buffer and context modeling in a CABAC processing environment. Such an embodiment is in contrast to existing systems, which possess a hardware-only or software-only based solution to CABAC processing and hence can suffer from at least some of the problems described above in the background section of the present disclosure.

Additionally, the automatic bitstream buffer provides certain advantages. For instance, once the location (e.g., address) of the bitstream is made known to a direct memory access (DMA) engine of the bitstream buffer, the management of the bitstream is automatic and hence involves no further instructions. Such a mechanism is in contrast to conventional microprocessor/digital signal processor (DSP) systems, where bitstream management represents a large overhead cost. Further, the bitstream buffer mechanisms, through tracking of the number of bits consumed, enables the detection and handling of a corrupt bitstream.

Another benefit of the decoding system embodiments described herein pertains to the minimization of instruction latency. Since CABAC decoding is very sequential and multi-threading is not easy to exploit, a type of forwarding mechanism (e.g., register forwarding) is employed in the various embodiments to reduce the effective dependency latency. Explaining further, a problem in many deep-pipelined, multi-threaded processors is that an instruction may not be executed every cycle out of the same thread. Some systems may employ general forwarding, which works by checking the address of the operands of the previous result and the instruction operand (if the same, the result operands are used). Such general forwarding typically requires a complex set of comparing and multiplexing. In certain embodiments of decoding systems, a different type of forwarding is employed whereby bits in the instructions are used (e.g., 1 bit for each of the operands for a total of two bits) to encode whether the result of a previous computation (e.g., held in internal registers) should be used or should data in the source operands be used. Through this method, overall latency can be reduced while improving the efficiency of the processor pipeline.

The decoding systems described herein are capable of decoding bitstreams according to the well-known International Telecommunication Union Telecommunication Standardization Sector (ITU-T) H.264 standard. Various embodiments of the decoding systems operate based on the execution of one or more instruction sets received (e.g., via well known mechanisms such as preloading or through cache misses) from a GPU frame buffer memory or memory corresponding to a host processor (e.g., host central processing unit (CPU)).

FIG. 1 is a block diagram of an embodiment of a graphics processor system 100 in which embodiments of decoding systems and methods are implemented. In some implementations, the graphics processor system 100 may be configured as a computer system. The graphics processor system 100 may comprise a display device 102 driven by a display interface unit (DIU) 104 and local memory 106 (e.g., which may comprise a display buffer, frame buffer, texture buffer, command buffer, etc.). Local memory 106 may also be referred to interchangeably herein as a frame buffer or storage unit. Local memory 106 is coupled to a graphics processing unit (GPU) 114 through one or more memory interface units (MIU) 110. The MIU 110, GPU 114, and DIU 104 are coupled in one embodiment to a peripheral component interconnect express (PCIE) compatible bus interface unit (BIU) 118. In one embodiment, the BIU 118 may employ a graphics address remapping table (GART), although other memory mapping mechanisms may be employed. The GPU 114 includes the decoding system 200, as described below. Although shown as a component of the GPU 114, in some embodiments, the decoding system 200 may include one or more additional components of the graphics processor system 100 that are shown, or different components.

The BIU 118 is coupled to a chipset 122 (e.g., north bridge chipset) or switch. The chipset 122 comprises interface electronics to strengthen signals from a central processing unit (CPU) 126 (also referred to herein as a host processor) and to separate signals to and from a system memory 124 from those signals going to and from input/output (I/O) devices (not shown). Although a PCIE bus protocol is described, other manners of connection and/or communication between the host processor and the GPU 114 may be implemented in some embodiments (e.g., PCI, proprietary high-speed bus, etc.). The system memory 124 also comprises driver software 128, which communicates instruction sets or commands through the use of the CPU 126 to registers in the GPU 114.

Additional graphics processing units may be employed in some embodiments, coupled for instance to the components shown in FIG. 1 through the chipset 122 via a PCIE bus protocol among others. In one embodiment, the graphics processor system 100 may embody all of the components shown in FIG. 1, or fewer and/or different components than those shown in FIG. 1. Further, in some embodiments, additional components may be used, such as a south bridge chipset coupled to the chipset 122.

Figure 2:
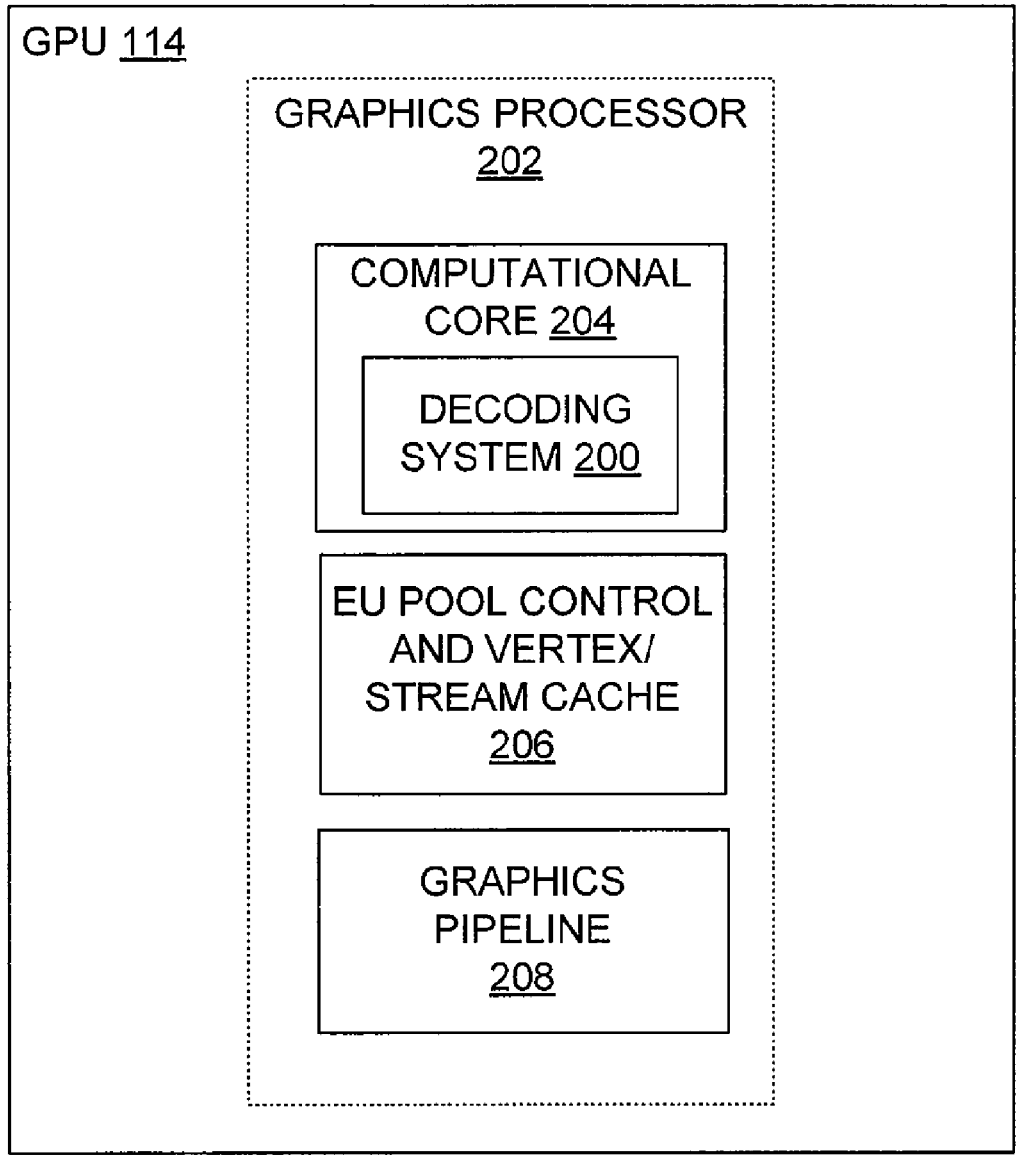
FIG. 2 is a block diagram that illustrates an exemplary processing environment in which various embodiments of decoding systems are implemented.

Reference is now made to FIG. 2, which is a block diagram that illustrates an exemplary processing environment in which an embodiment of a decoding system 200 is implemented. In particular, the GPU 114 is shown, and includes a graphics processor 202. The graphics processor 202 comprises a multiple execution unit (EU), computational core 204 (also known as software programmable core processing unit) that, in one embodiment, comprises the decoding system 200 (also known as context-adaptive binary arithmetic (CABAC) unit) embedded in an execution unit data path (EUDP) distributed among one or more execution units. The graphics processor 202 also comprises an execution unit pool control (EUP) and vertex/stream cache unit 206 (herein, EU pool control unit 206) and a graphics pipeline with fixed function logic 208 (e.g., including a triangle set-up unit (TSU), span-tile generator (STG), etc.) as explained below. The computational core 204 comprises a pool of multiple execution units to meet the computing requirements imposed by shader tasks associated with various shader programs, including a vertex shader, geometry shader, and/or pixel shader processing data for the graphics pipeline 208. As the functionality of the decoding system 200 in one embodiment is implemented largely through a shader of the computational core 204, a general description of an embodiment of a graphics processor is described, followed by the particulars of certain embodiments of the decoding system 200.

The decoding system 200 can be implemented in hardware, software, firmware, or a combination thereof. In the preferred embodiment(s), the decoding system 200 is implemented in hardware and software, including any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), state machine, etc.

Figure 3:
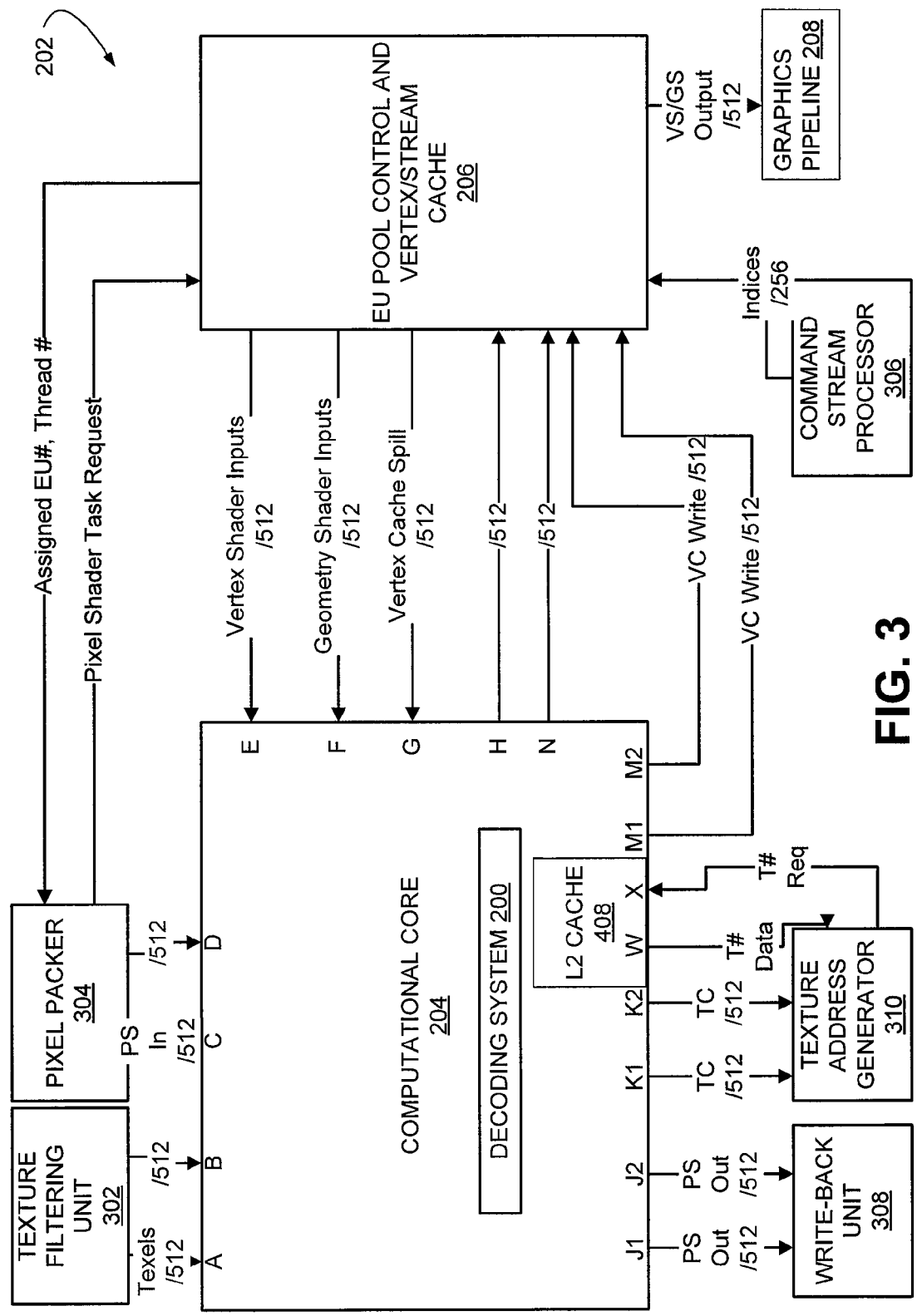
FIG. 3 is a block diagram that illustrates select components of the exemplary processing environment shown in FIG. 2.
Figure 4:
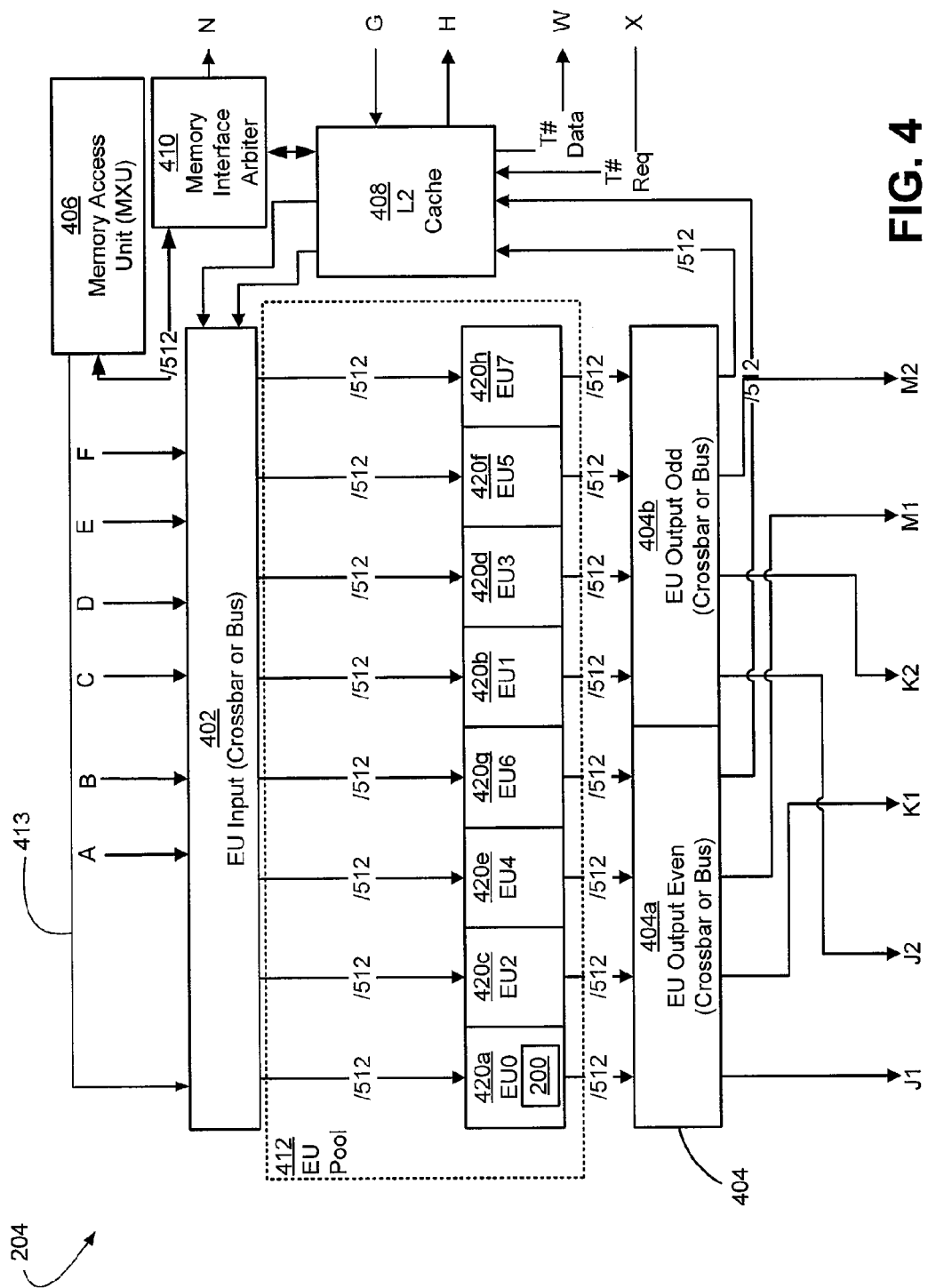
FIG. 4 is a block diagram that illustrates a computational core of the exemplary processing environment shown in FIGS. 2-3 in which various embodiments of decoding systems are implemented.

Reference is now made to FIGS. 3-4, which are block diagrams that each show select components of an embodiment of a graphics processor 202. As explained above, since one embodiment of a decoding system 200 can be implemented as a shader in the graphics processor 202 with an extended instruction set and additional hardware components, a general description of an embodiment of a graphics processor 202 and corresponding processing is described below. While not all components for graphics processing are shown, the components shown in FIGS. 3-4 should be sufficient for one having ordinary skill in the art to understand the general functions and architecture related to such graphics processors. Referring to FIG. 3, at the center of the programmable processing environment is a computational core 204, which processes various instructions and includes the decoding system 200. Various types of shader programs can be executed or mapped to the computational core 204, including vertex, geometry and pixel shader programs. The computational core 204, for multi-issue processors, is capable of processing multiple instructions within a single clock cycle.

As shown in FIG. 3, the relevant components of the graphics processor 202 comprise the computational core 204, a texture filtering unit 302, a pixel packer 304, a command stream processor 306, a write-back unit 308, and a texture address generator 310. Also included in FIG. 3 is the EU pool control unit 206, which also includes a vertex cache and/or a stream cache. For example, as shown in FIG. 3, the texture filtering unit 302 provides texel data to the computational core 204 (inputs A and B). For some embodiments, the texel data is provided as 512-bit data.

The pixel packer 304 provides pixel shader inputs to the computational core 204 (inputs C and D), also in 512-bit data format. Additionally, the pixel packer 304 requests pixel shader tasks from the EU pool control unit 206, which provides an assigned EU number and a thread number to the pixel packer 304. Since pixel packers and texture filtering units are known in the art, further discussion of these components is omitted here. While FIG. 3 shows the pixel and texel packets as 512-bit data packets, it should be appreciated that the size of the packets can be varied for some embodiments, depending on the desired performance characteristics of the graphics processor 202.

The command stream processor 306 provides triangle vertex indices to the EU pool control unit 206. In the embodiment of FIG. 3, the indices are 256-bits. The EU pool control unit 206 assembles vertex shader inputs from the stream cache and sends data to the computational core 204 (input E). The EU pool control unit 206 also assembles geometry shader inputs and provides those inputs to the computational core 204 (input F). The EU pool control unit 206 also controls an EU input 402 (FIG. 4) and an EU output 404 (FIG. 4). In other words, the EU pool control unit 206 controls the respective inflow and outflow to the computational core 204.

Upon processing, the computational core 204 provides pixel shader outputs (outputs J1 and J2) to the write-back unit 308. The pixel shader outputs include color information, such as red/green/blue/alpha (RGBA) information, which is known in the art. Given the data structure in the disclosed embodiment, the pixel shader output may be provided as two 512-bit data streams. Other bit-widths may also be implemented in some embodiments.

Similar to the pixel shader outputs, the computational core 204 outputs texture coordinates (outputs K1 and K2), which include UVRQ information, to the texture address generator 310. The texture address generator 310 issues a texture descriptor request (T# Req) to an L2 cache 408 of the computational core 204 (input X), and the L2 cache 408 of computational core 204 outputs (output W) the texture descriptor data (T# data) to the texture address generator 310. Since the various examples of the texture address generator 310 and the write-back unit 308 are known in the art, further discussion of those components is omitted here. Again, while the UVRQ and the RGBA are shown as 512 bits, it should be appreciated that this parameter may also be varied for some embodiments. In the embodiment of FIG. 3, the bus is separated into two 512-bit channels, with each channel holding the 128-bit RGBA color values and the 128-bit UVRQ texture coordinates for four pixels.

The graphics pipeline 208 comprises fixed-function graphics processing functionality. Responsive to a command from the driver software 128, such as to draw a triangle, vertex information is passed to vertex shader logic in the computational core 204 to implement vertex transformations. In particular, objects are transformed from object space to work space and/or screen space as triangles. The triangles are passed from the computational core 204 to a triangle set-up unit (TSU) in the graphics pipeline 208, which assembles primitives, and also performs well-known tasks such as bounding box generation, culling, edge function generation, and triangle level rejections, among other well-known functions. The TSU passes data to a span and tile generation unit of the graphics pipeline 208, which provides tile generation functionality, whereby the data objects are segmented into tiles (e.g., 8×8, 16×16, etc.) and passed to another fixed function unit configured to performs depth (e.g., z-value) processing, such as high level (e.g., where fewer bits are consumed than similar processing at a lower level) rejection of z-values. The z-values are passed back to pixel shader logic in the computational core 204 for the performance of pixel shader functionality based on received texture and pipelined data. The computational core 204 outputs processed values to destination units located in the graphics pipeline 208. The destination units are configured to perform alpha testing and stencil testing before values in various caches need to be updated.

Note that the L2 cache 408 of the computational core 204 and the EU pool control unit 206 also transfer to each other 512-bit vertex cache spill data. Additionally, two 512-bit vertex cache writes are output from the computational core 204 (outputs M1 and M2) to the EU pool control unit 206 for further handling.

Referring to FIG. 4, additional components of the computational core 204 and related components are shown. The computational core 204 comprises an execution unit (EU) pool 412, which in one embodiment comprises one or more execution units (EUs) 420a through 420h (collectively referred to herein as EUs 420). Each of the EUs 420 is capable of processing multiple instructions within a single clock cycle. Thus, the EU pool 412, at its peak, can process multiple threads simultaneously or substantially simultaneously. While eight (8) EUs 420 are shown in FIG. 4 (labeled EU0 through EU7), it should be appreciated that the number of EUs need not be limited to eight, but may be greater or fewer in number for some embodiments. At least one of the execution units, for instance EU0 420a, comprises an embodiment of the decoding system 200, as explained further below.

The computational core 204 also comprises a memory access unit 406 that is coupled to the L2 cache 408 through a memory interface arbiter 410. The L2 cache 408 receives vertex cache spill (input G) from the EU pool control unit 206 and provides vertex cache spill (output H) to the EU pool control unit 206. Additionally, the L2 cache 408 receives texture descriptor T# requests (input X) from the texture address generator 310, and provides the texture descriptor T# data (output W) to the texture address generator 310 in response to the received request.

The memory interface arbiter 410 provides a control interface to the local video memory (e.g., frame buffer or local memory 106). The BIU 118 provides an interface to the system through, for example, a PCIE bus. The memory interface arbiter 410 and BIU 118 provide the interface between the memory and the L2 cache 408. For some embodiments, the L2 cache 408 connects to the memory interface arbiter 410 and the BIU 118 through the memory access unit 406. The memory access unit 406 translates virtual memory addresses from the L2 cache 408 and other blocks to physical memory addresses.

The memory interface arbiter 410 provides memory access (e.g., read/write access) for the L2 cache 408, fetching of instructions/constants/data/texture, direct memory access (e.g., load/store), indexing of temporary storage access, register spill, vertex cache content spill, etc.

The computational core 204 further comprises an EU input 402 and an EU output 404, which are respectively configured to provide the inputs to the EU pool 412 and receive the outputs from the EU pool 412. The EU input 402 and the EU output 404 may be crossbars or buses or other known input and output mechanisms.

The EU input 402 receives the vertex shader input (E) and the geometry shader input (F) from the EU pool control unit 206, and provides that information to the EU pool 412 for processing by the various EUs 420. Additionally, the EU input 402 receives the pixel shader input (inputs C and D) and the texel packets (inputs A and B), and conveys those packets to the EU pool 412 for processing by the various EUs 420. Additionally, the EU input 402 receives information from the L2 cache 408 (L2 read) and provides that information to the EU pool 412 as needed.

The EU output 404 in the embodiment of FIG. 4 is divided into an even output 404a and an odd output 404b. Similar to the EU input 402, the EU output 404 can be crossbars or buses or other known architectures. The even EU output 404a handles the output from the even EUs 420a, 420c, 420e, 420g, while the odd EU output 404b handles the output from the odd EUs 420b, 420d, 420f, 420h. Collectively, the two EU outputs 404a, 404b receive the output from the EU pool 412, such as the UVRQ and the RGBA. Those outputs, among others, may be directed back to the L2 cache 408, or output from the computational core 204 to the write-back unit 308 through J1 and J2 or output to the texture address generator 310 through K1 and K2.

The execution unit flow of the EU pool 412 generally comprises several levels, including a rendering context level, thread or task level, and an instruction or execution level. At any given time, there may be two rendering contexts allowed in each execution unit 420, with the contexts identified by the use of a one bit flag or other mechanisms. The context information is passed from the EU pool control unit 206 before tasks belonging to this context are commenced. Context level information may include shader type, number of input/output registers, instruction starting address, output mapping table, vertex identifier, and constants in a respective constant buffer. Each execution unit 420 of the EU pool 412 may store a plurality of tasks or threads (e.g., in some embodiments, thirty-two threads) at the same time. In one embodiment, each thread fetches an instruction according to a program counter.

The EU pool control unit 206 functions as global scheduler for the tasks and assigns appropriate threads in the execution units 420, using a data-driven approach (e.g., vertex, pixel, geometry packet in the input). For instance, the EU pool control unit 206 assigns a thread to one of the empty thread slots in the respective execution unit 420 of the EU pool 412. Data fed by a vertex cache or other component or module (depending on the shader type) is placed in a common register buffer, after which execution of a thread may commence.

In general, an embodiment of the graphics processor 202 utilizes programmable vertex, geometry, and pixel shaders. Rather than implementing the functions or operations of these components as separate fixed function units with different designs and instruction sets, the operations are instead executed by the pool of execution units 420a, 420b . . . 420n with a unified instruction set. Each of these execution units 420, except EU 420a (which comprises the decoding system 200 and thus has added functionality) is identical in design and configurable for programmed operation. In one embodiment, each execution unit 420 is capable of multi-threaded operations simultaneously. As various shader tasks are generated by the vertex shader, geometry shader, and pixel shader, they are delivered to the respective execution units 420 to be carried out. The decoding system 200 may be implemented in one embodiment using a vertex shader, with some modifications and/or differences from other execution units 420. For instance, one difference between an execution unit embodying the decoding system 200, such as the execution unit 420a, and the other execution units (e.g., 420b of FIG. 4), is that data for the decoding system 200 is received from the MXU 406 via connection 413 and the EU input 402, due in part to the management by the decoding system 200 of one or more corresponding internal buffers.

As individual tasks are generated, the EU pool control unit 206 handles the assigning of those tasks to available threads within the various execution units 420. As tasks are completed, the EU pool control unit 206 further manages the release of the relevant threads. In this regard, the EU pool control unit 206 is responsible for assigning vertex shader, geometry shader, and pixel shader tasks to threads of the various execution units 420, and also, performs an associated "bookkeeping" of the tasks and threads. Specifically, the EU pool control unit 206 maintains a resource table (not specifically illustrated) of threads and memories for all execution units 420. The EU pool control unit 206 particularly knows which threads have been assigned tasks and are occupied, which threads have been released after thread termination, how many common register file memory registers are occupied, and how much free space is available for each execution unit.

Accordingly, when a task is assigned to one execution unit (e.g., 420a), the EU pool control unit 206 will mark the thread as busy and subtract the total available common register file memory by the amount of the appropriate register file footprint for each thread. This footprint is set or determined by states for the vertex shader, geometry shader and pixel shader. Further, each of the shader stages may have different footprint sizes. For example, a vertex shader thread may require ten (10) common register file registers, while a pixel shader thread may only require five such registers.

When a thread completes its assigned task(s), the execution unit 420 running the thread sends an appropriate signal to the EU pool control unit 206. The EU pool control unit 206, in turn, updates its resource table to mark the thread as free and to add the amount of total thread common register file space back to the available space. When all threads are busy or all the common register file memory has been allocated (or there is too little register space remaining to accommodate an additional thread), then the execution unit 420 is considered full and the EU pool control unit 206 will not assign any additional or new threads to that execution unit.

A thread controller is also provided inside each of the execution units 420, and this thread controller is responsible for managing or marking each of the threads as active (e.g., executing) or available. In this regard, at least in one embodiment, the EU pool control unit 206 can prohibit the geometry shader and pixel shader from running at the same time as the vertex shader when the vertex shader is executing functionality of the decoding system 200.

Figure 5A:
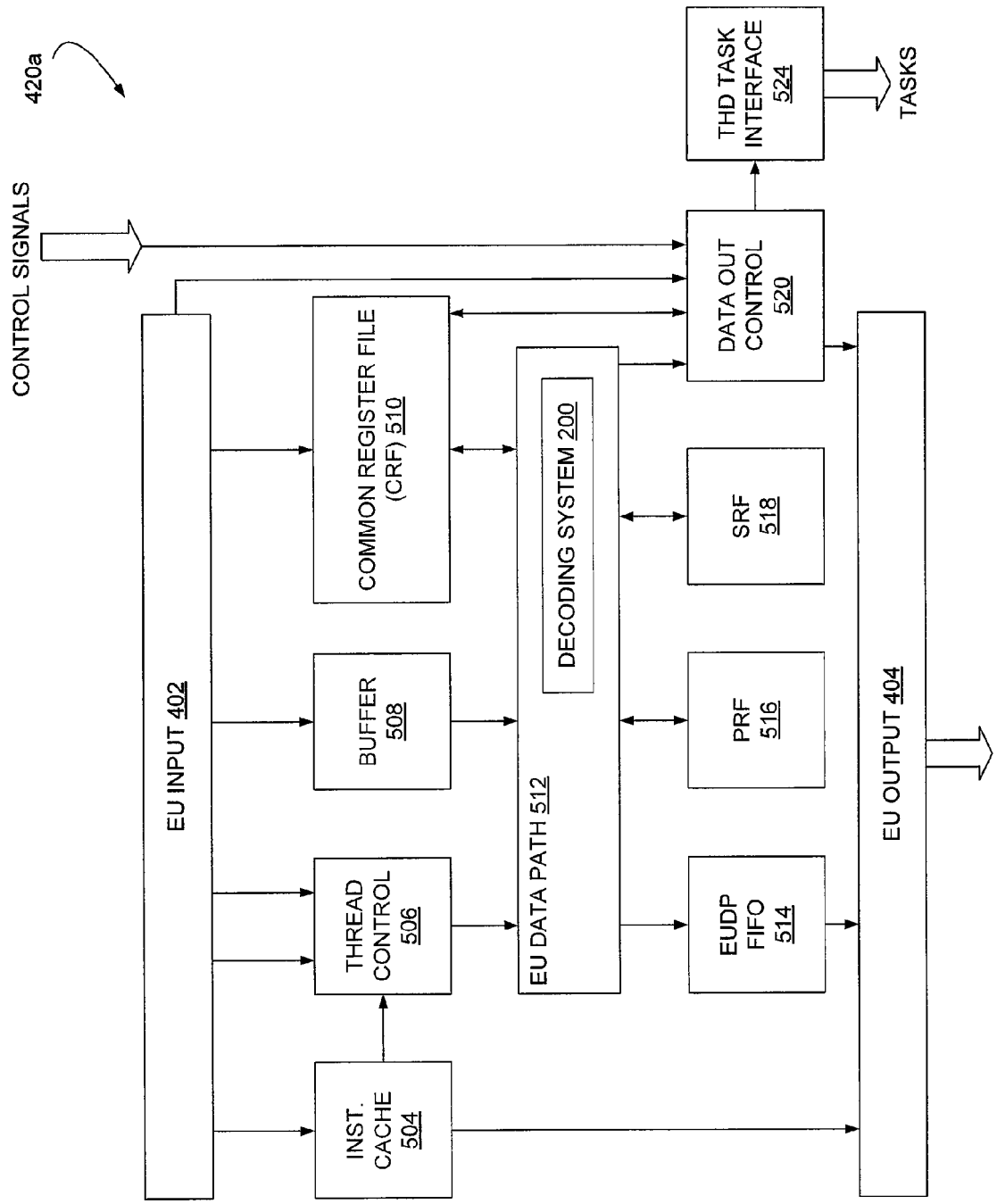
FIG. 5A is a block diagram that illustrates select components of an execution unit of the computational core shown in FIG. 4 in which in which various embodiments of decoding systems are implemented.

Having described various features of an embodiment of a graphics processor 202 and computational core 204, an embodiment of the execution unit 420a including an EU data path in which the decoding system 200 is embedded is now described in association with FIG. 5A. In particular, FIG. 5A is a block diagram of the execution unit 420a, which in one embodiment, comprises an instruction cache controller 504, a thread controller 506 coupled to the instruction cache controller 504, a buffer 508, a common register file (CRF) 510, an EU data path (EUDP) 512 coupled to the thread controller 506, buffer 508, and CRF 510, an EUDP FIFO 514, a Predicate Register File (PRF) 516, a Scalar Register File (SRF) 518, a data out controller 520, and a thread task interface 524. As explained above, the execution unit 420a receives input from EU input 402 and provides an output to EU output 404.

The thread controller 506 provides control functionality for the entire execution unit 420a, with functionality including the management of each thread and decision-making functionality such as determining how threads are to be executed. The EUDP 512 comprises the decoding system 200, as explained further below, and in general, comprises functionality for performing various calculations, and includes such logic as floating point and integer arithmetic logic units (ALUs), shift logic functionality, among other logic.

The data out controller 520 comprises functionality to move finished data to certain components connected to the EU output 404, such as the vertex cache of the EU pool control unit 206, write back unit 308, etc. The EUDP 512 passes "end of task" information to the data out controller 520, notifying the same that a task is completed. The data out controller 520 comprises storage for the completed task (e.g., 32 entries), as well as a plurality of write ports. The data out controller 520 selects tasks from storage, and reads out all output data items in register locations specified by a shader rendering-context from the CRF 510 and sends data to the EU output 404.

The thread task interface 524 sends out task identifiers that are completed in the execution unit 420a to the EU pool control unit 206. That is, the task identifiers provide notification to the EU pool control unit 206 that a thread resource in a particular execution unit, for instance execution unit 420a, is available for a new task assignment.

In one embodiment, the buffer 508 (e.g., constant buffer) may be divided up into 16 blocks, with each block having 16 slots with 128-bit horizontal vector constants in each. A constant buffer slot is accessed in a shader using an operand and index, wherein the index may be a temporary register comprising, for example, a 32-bit unsigned integer or an immediate 32-bit unsigned integer constant.

The instruction cache controller 504 is an interface block to the thread controller 506. When there is a thread controller read request (e.g., to fetch executable shader code from instruction memory), the instruction cache controller 504 preferably performs a hit/miss test by looking up a tag table (not shown). For example, a hit occurs when a requested instruction is in a cache of the instruction controller 504. A miss occurs when this requested instruction is to be fetched from the L2 cache 408 or memory 106. If a hit occurs, the instruction cache controller 504 grants the request if there is no request from the EU input 402 because the instruction cache of the instruction cache controller 504 has 1 RW port limitation and the EU input 402 has higher priority. Otherwise, if a miss occurs, the instruction cache controller 504 grants the request when there is a replaceable block in the L2 cache 408 and there is space in the pending request EUDP FIFO 514. In one embodiment, the cache of the instruction cache controller 504 comprises 32 sets, with four blocks per set. Each block carries a 2-bit status signal to indicate three (3) states of invalid, loading, or valid. A block is "invalid" before being loaded with L2 data, becomes "loading" when waiting for L2 data, and becomes "valid" after L2 data loads in.

The predicate register file (PRF) 516 is read from and written to by the EUDP 512. The EU input 402 serves as an interface for incoming data to the execution unit 420a. In one embodiment, the EU input 402 comprises an 8-entry FIFO to buffer the incoming data. The EU input 402 also comprises functionality to pass data to the instruction cache of the instruction cache controller 504 and the constant buffer 508. The EU input 402 also maintains shader contexts.

The EU output 404 serves as an interface for outgoing data from the execution unit 420a into the vertex cache of the EU pool control unit 206, the L2 cache 408, and the write back unit 308. In one embodiment, the EU output 404 comprises a 4-entry FIFO to receive arbitrated requests and to buffer the data for the EU pool control unit 206. The EU output 404 comprises various functionality, including functionality to arbitrate the request from an instruction cache read request, data out write request, and EUDP read/write request.

The CRF 510 is used to store input, output, and temporary data. In one embodiment, the CRF 510 comprises eight (8) banks with 1R1W and 1RW ports of a 128×128-bit register file. The 1R+1W ports are used by the EUDP 512 for read and write access initiated by instruction execution. Banks 0, 2, 4, and 6 are shared among even numbered threads and banks 1, 3, 5, and 7 are shared among odd numbered threads. The thread controller 506 pairs instructions from different threads and ensures that there is no read or write bank conflict on the CRF memories.

The 1RW port is used by the EU input 402 and data out controller 520 for loading the initial thread input data and writing the final thread output to the EU pool control unit data buffers and L2 cache 408 or other modules. The 1RW I/O port is shared by both the EU input 402 and EU output 404, and write in one embodiment has higher priority than read. The 512-bits of the input data goes to four different banks to avoid any conflict when loading data into the CRF 510. A 2-bit channel index is passed in along with the data and 512-bit aligned base address to specify the starting bank of the input data. For example, if the starting channel index is 1, then the first 128-bits from the least significant bit (LSB) is loaded into bank 1, the next into bank 2, . . . etc., and the last into bank 0, assuming the thread based bank offset is 0. Note the two LSBs of the thread ID are used to generate a bank offset to randomize the starting bank location for each thread.

The CRF register index along with the thread ID can be used to construct a unique logical address for tag matching in reading and writing data in the CRF 510. For instance, the address may be aligned to 128 bits, the width of the CRF bank. Thirteen (13) bits of the address may be constructed from combining the 8-bit CRF register index and the 5-bit thread ID to create a unique address. Each 1024-bit line has a tag, and there are two 512-bit entries (words) on each line. Each word is stored across four banks and the two LSBs of the CRF index are added to the bank offset of current thread to create the bank selection.

The tag matching scheme allows the registers of different threads to share the CRF 510 to make good utilization of the memory, since the EU pool control unit 206 keeps track of memory usage of the CRF 510 and ensures there is enough space before scheduling a new task to the execution unit 420a.

The destination CRF index is checked against the size of the total CRF registers for a current thread. The input data is expected to be present in the CRF 510 before the thread controller 506 commences the thread and shader execution begins. The output data is read from the CRF 510 by the data out controller 520 after thread execution ends.

Figure 5B:
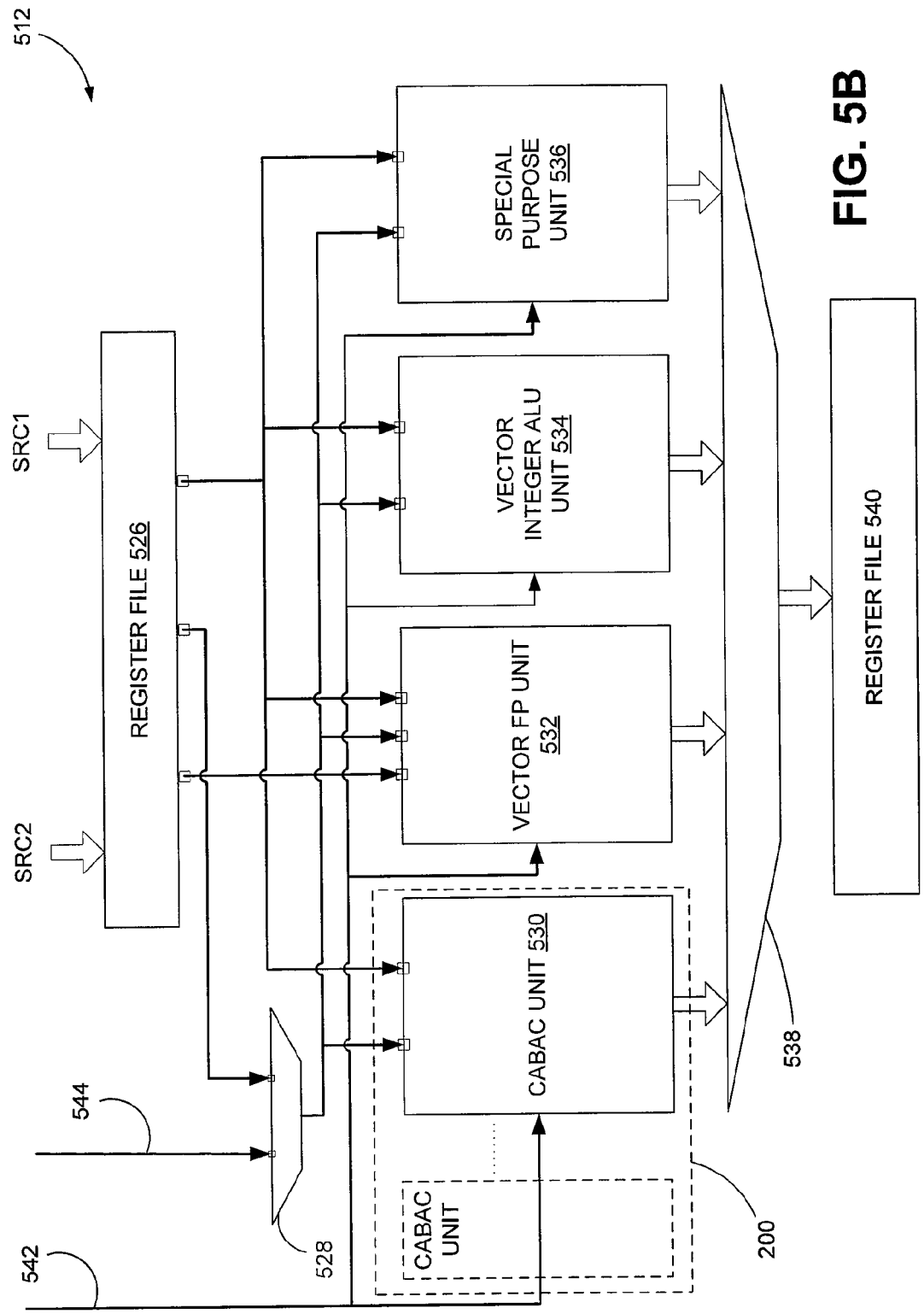
FIG. 5B is a block diagram of an execution unit data path in which various embodiments of decoding systems are implemented.

Having described an embodiment of an execution unit 420a comprising an EUDP 512 in which an embodiment of the decoding system 200 is implemented, an embodiment of the EUDP 512 is shown in FIG. 5B and described as follows. The EUDP 512 comprises a register file 526, a multiplexer 528, a vector floating point (FP) unit 532, a vector integer ALU unit 534, a special purpose unit 536, a multiplexer 538, a register file 540, and the decoding system 200. The decoding system 200 comprises one or more CABAC units 530, resulting in the ability to decode one or more streams. For instance, a single CABAC unit 530 enables the decoding of a single stream, two CABAC units 530 (e.g., one shown in phantom but without connections for brevity) enables the simultaneous decoding of two streams, etc. For purposes of illustration, the below description addresses the operations of the decoding system 200 using a single CABAC unit 530, with the understanding that the principles can be similarly applied to more than a single CABAC unit.

As shown, the EUDP 512 comprises a number of parallel datapaths corresponding to the CABAC decoding unit 530, vector floating point unit 532, vector integer ALU unit 534, and special purpose unit 536, each of which executes a corresponding operation based on the received instruction. Operands (denoted SRC1 and SRC2) are received at the register file 526, the latter of which in one embodiment may correspond to the CRF 510, PRF 516, and/or SRF 518 shown in FIG. 5A. Note that in some embodiments, additional operands may be used. Operation (function) signal line 542 provides a medium for the receipt of operation signals to be received at each respective unit 530-536. Immediate signal line 544, coupled to the multiplexer 528, carries an immediate value encoded into instructions for use by each unit 530-536 in carrying out integer operations on small integer values. The operands, operation (function) signals, and immediate signals are provided by an instruction decoder (not shown). The multiplexer 538 at the end of the datapaths (which may comprise a writeback phase) selects a result of the correct datapath that is selected and provides an output to the register file 540. The output register file 540 comprises a destination, and may be the same component as the register file 526 or a different register. Note that in embodiments where the source and destination register comprise the same component, bits are provided in the instructions with source and destination selects that are used by the mutliplexer to multiplex the data to/from the appropriate register file.

Hence, the execution unit 420a may be viewed as a multi-stage (e.g., four (4)-stage pipeline, with four arithmetic logic units (ALUs)), and CABAC decoding operations occur within the four execution phases. Stalls are implemented as needed to allow CABAC decoding threads to be executed. For instance, stalls may be incorporated in the execution of the stages when there is an underflow in a bit stream buffer, when waiting for context memory to be initialized, when waiting for the bitstream to be loaded into a FIFO buffer and sREG register (explained below), and/or generally when processing time has exceeded a predetermined threshold of time.

As explained above, in some embodiments, the decoding system 200 is configured for the simultaneous decoding of two bit streams using a single execution unit 420a. For instance, the decoding system 200 can employ two data paths (e.g., with the addition of another CABAC unit 530) to perform simultaneous two-stream decoding according to an extended instruction set, although fewer or greater streams may be decoded (and hence fewer or greater data paths may be utilized) at one time. Certain embodiments of the decoding system 200 are not limited to simultaneous decoding when multiple streams are involved. Further, in some embodiments, a single CABAC unit 530 may implement multiple simultaneous decoding of streams.

In embodiments where the decoding system 200 employs two data paths, two threads may run at the same time. For instance, in a two-stream decoding embodiment, the number of threads are limited to two, with a first thread (e.g., thread0) assigned to a first bank (i.e., CABAC unit 530) of the decoding system 200 and a second thread (e.g., thread1) assigned to a second bank (e.g., the CABAC unit shown in phantom in FIG. 5B) of the decoding system 200. In some embodiments, two or more threads may run on a single bank. In some embodiments, the decoding system 200, though shown as embedded within the EUDP 512, may comprise additional components, such as logic in the EU pool control unit 206.

Having described certain embodiments of the execution unit 420a, the EUDP 512, and the CABAC unit 530, a brief explanation of CABAC decoding in general is explained below, followed by a description of certain embodiments of a decoding system 200. In general, an H.264 CABAC decoding process can be described as comprising the parsing of an encoded bitstream for a first syntax element, initialization of context variables and the decoding engine for the first syntax element of a slice, and binarization. Then, for each bin decoding, the process comprises obtaining a context model and the decoding of bins of a respective syntax element until a match to a meaningful codeword is obtained. Explaining further, the decoding system 200 decodes syntax elements, where each syntax element may represent quantized coefficients, motion vectors, and/or prediction modes, among other parameters pertaining to a macroblock or macroblocks used to represent a particular field or frame of an image or video. Each syntax element may comprise a series of one or more binary symbols or bins, with each binary symbol decoded as a zero (0) or one (1) value. The decoding system 200 controls the output bit length according to the occurrence probability of the input binary symbols.

As is known, a CABAC encoder provides a highly efficient coding scheme when it is known that certain symbols (referred to as dominant symbols) are more likely than other symbols. Such dominant symbols may be encoded with small bit/symbol ratios. The encoder continually updates the frequency statistics of incoming data and adaptively adjusts the arithmetic and context models of the coding algorithm. The binary symbol with the higher probability is called the most probable symbol (MPS), and the other symbol is the least probable symbol (LPS). A binary symbol has associated with it a context model, with each context model corresponding to the LPS probability and a most probable symbol (MPS) value.

To decode each binary symbol, the decoding system 200 determines or receives a corresponding range, offset, and context model. The context model is selected from a plurality of possible context models based on the type of symbol and the context of decisions made for spatial neighbors (e.g., either a current macroblock or adjacent macroblocks subject to previous decoding). A context identifier can be determined through the context model and used to obtain the MPS value and the current state of the decoding engine for use in the decoding process. The range indicates an interval that is narrowed after each bin decoding.

The interval is divided into two sub-ranges corresponding respectively to the MPS value and the LPS probability. The LPS sub-range is calculated by multiplying the range and the LPS probability specified in a given context model. The MPS sub-range is calculated by subtracting the LPS sub-range from the range. The offset is a criteria for deciding a decoded bin, and is typically initialized by taking the first nine (9) bits from the encoded bitstream. For a given binary symbol decoding and context model, if the offset is less than the MPS sub-range, the bin is the MPS value and the range to be used in the next decoding is set to the MPS sub-range. Otherwise, the bin is determined to be LPS, the inversion of the MPS value contained in the associated context model, and the next range is set to the LPS sub-range. The result of the decoding process is a sequence of decoded bins, which is evaluated to determine whether the sequence matches with a meaningful codeword.

Given the general overview of the operations of the decoding system 200 as it relates to CABAC decoding, the following description sets forth an explanation of the various components of the decoding system 200 in the context of the CABAC decoding process, with the understanding that variations consistent with accepted practices of the standard are contemplated. It should be appreciated by one having ordinary skill in the art in the context of this disclosure that many of the terms used below can be found in the H.264 specification, and hence explanation of much of the same is omitted for brevity except where helpful to the understanding of the various processes and/or components described below.

Figure 6A:
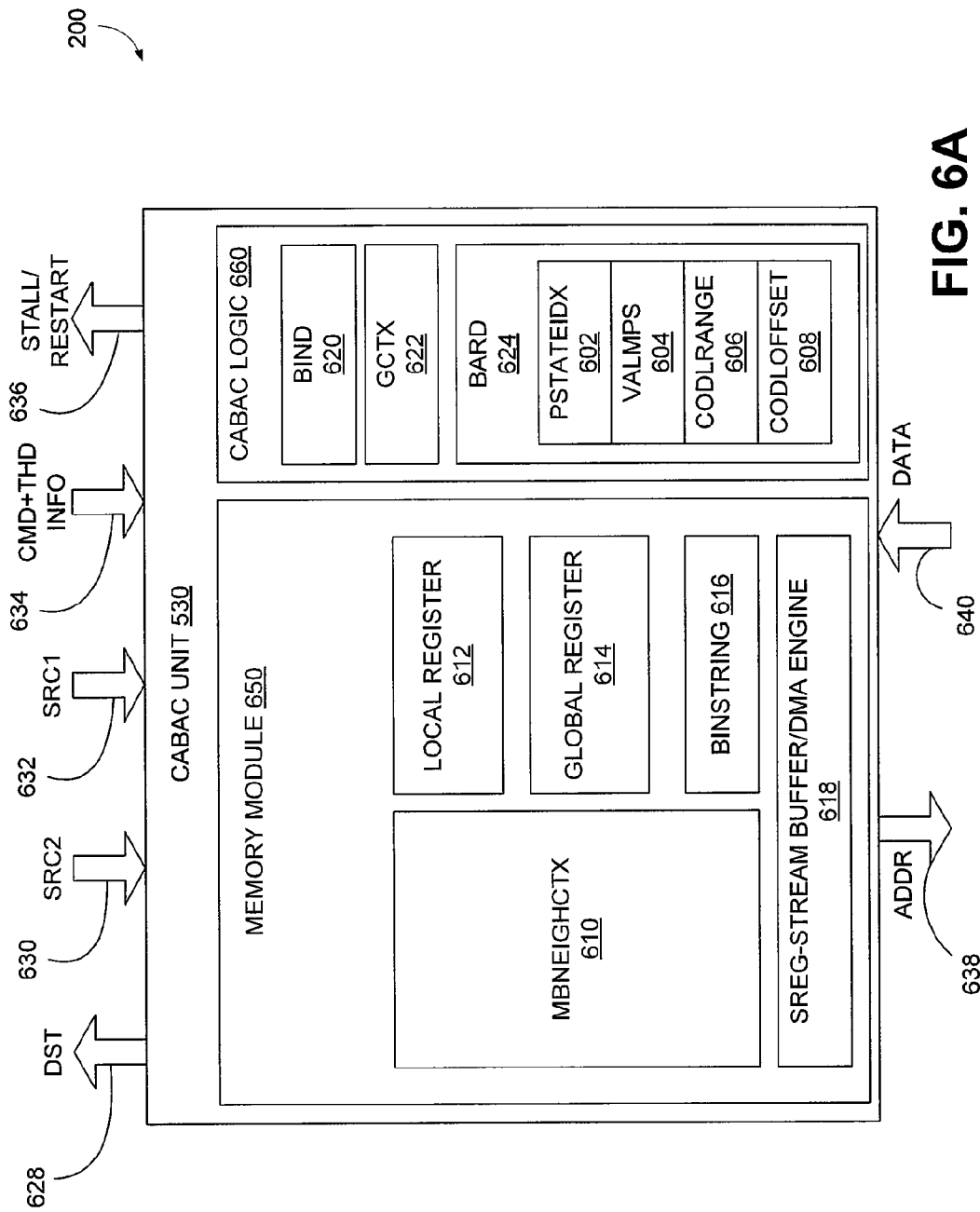
FIG. 6A is a block diagram of a decoding system embodiment as shown in FIG. 5.
Figure 6B:
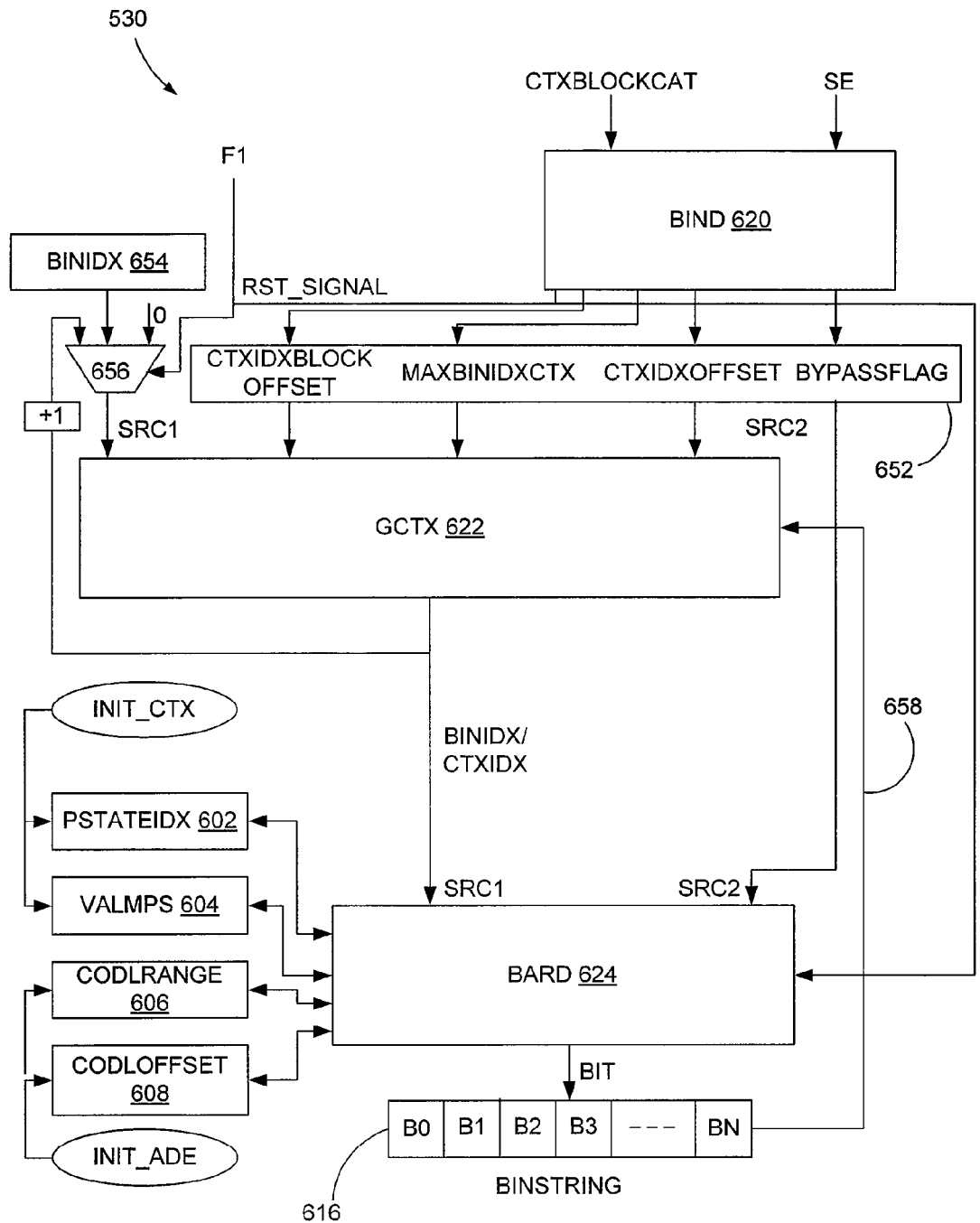
FIG. 6B is a block diagram further illustrating the decoding system shown in FIG. 6A.
Figure 6C:
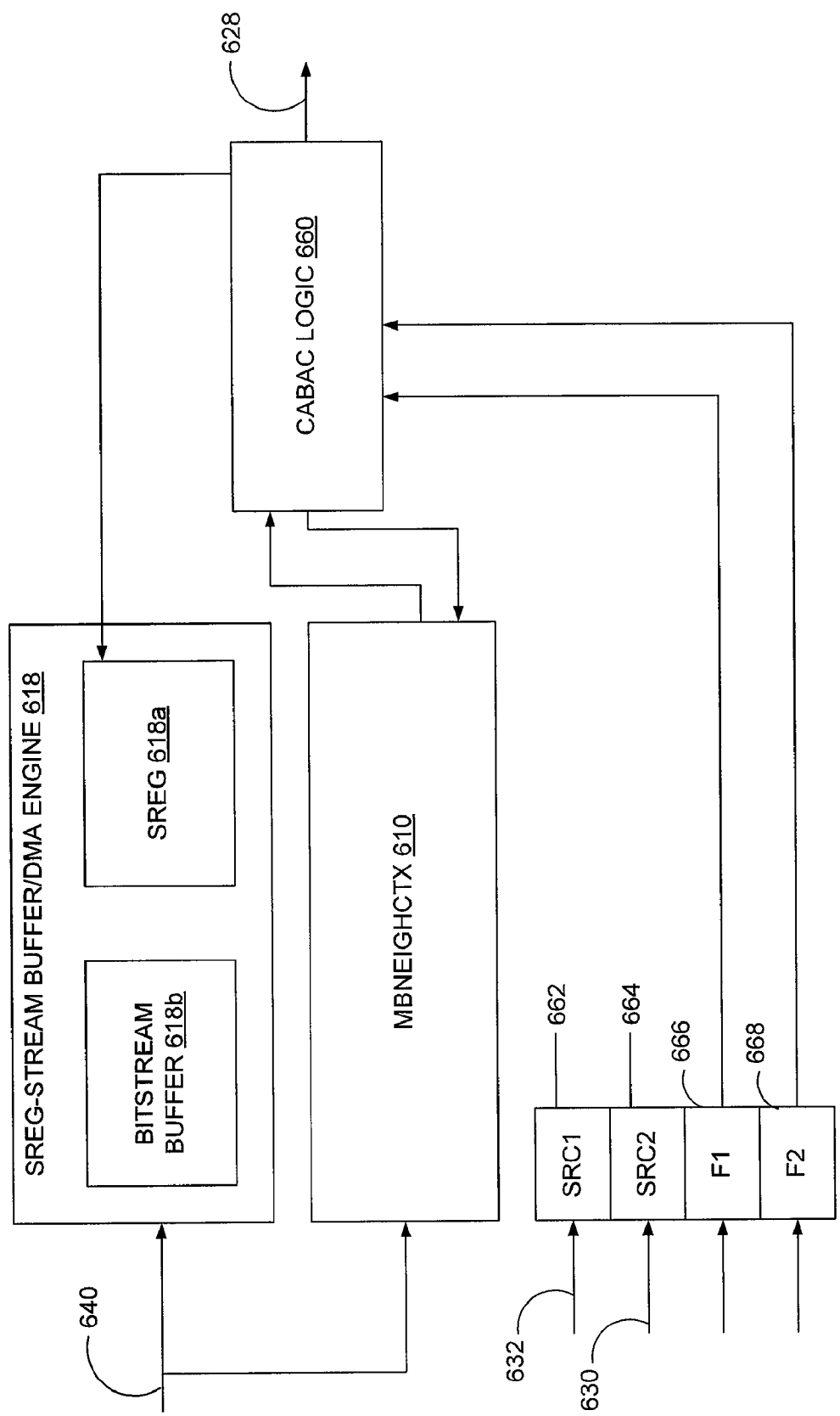
FIG. 6C is a block diagram that illustrates an embodiment of a bitstream buffer of the decoding system shown in FIG. 6A.
Figure 6D:
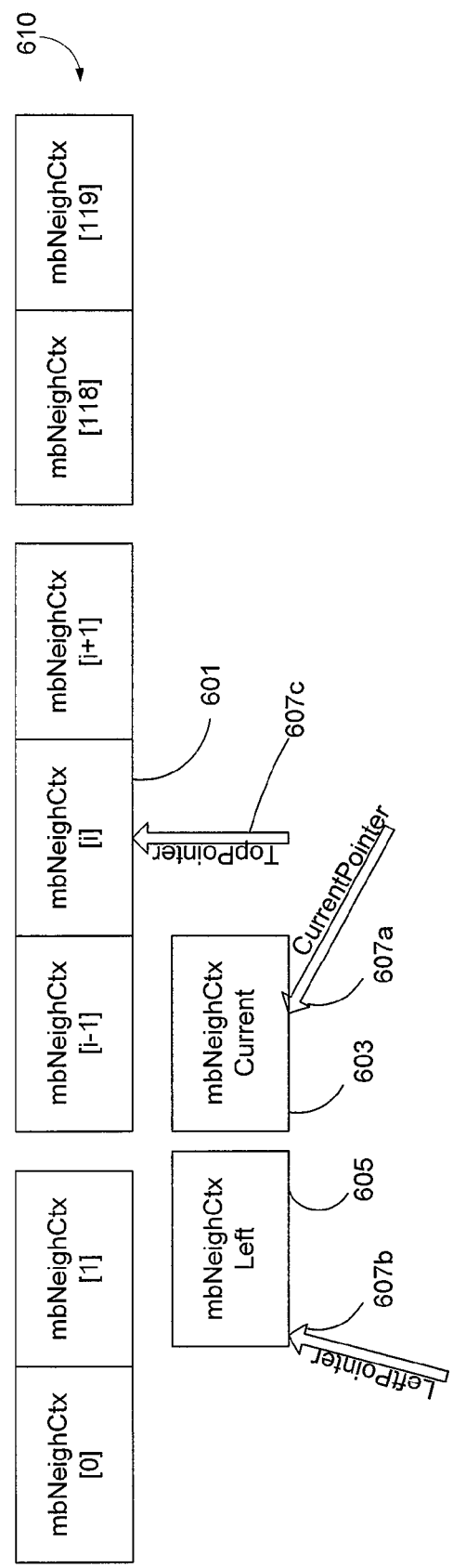
FIG. 6D is a block diagram that illustrates an embodiment of a context memory structure and associated registers of the decoding system shown in FIG. 6A.
Figure 6E:
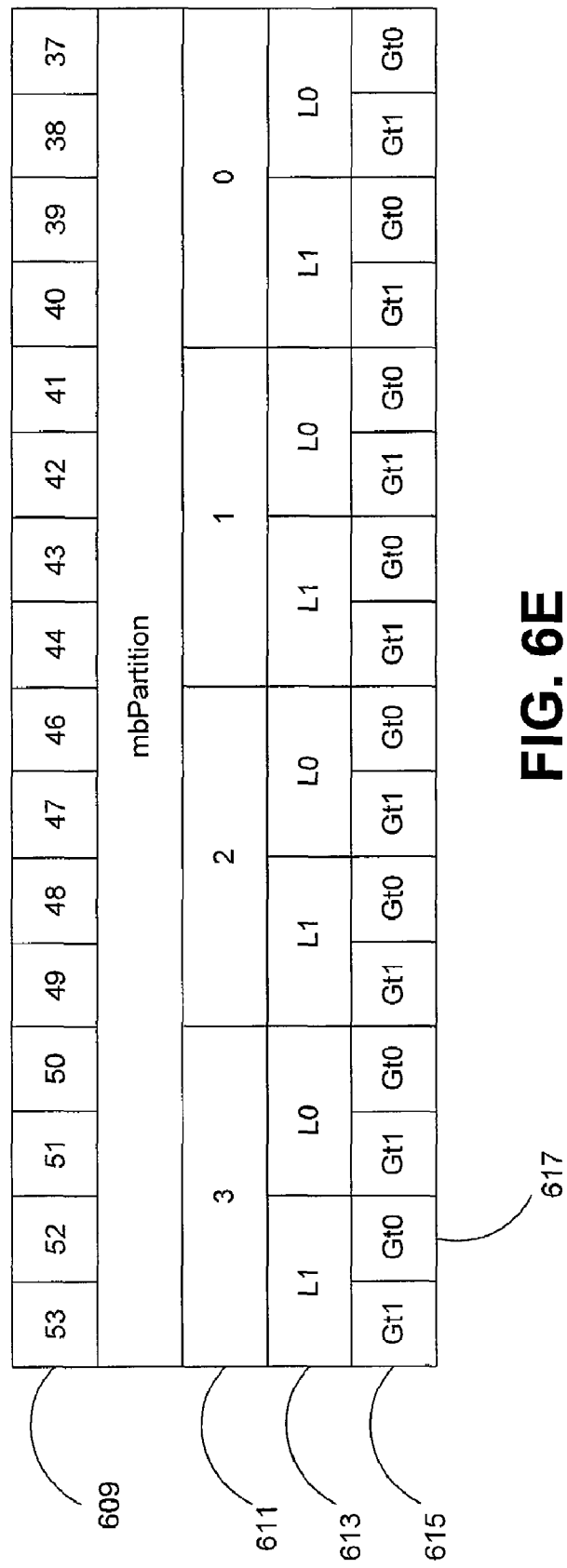
FIG. 6E is a block diagram that illustrates an embodiment of a macroblock partitioning scheme used by the decoding system shown in FIG. 6A.

FIGS. 6A-6F are block diagrams that illustrate certain embodiments of a decoding system 200 and associated components. A single CABAC unit 530 is shown associated with the decoding system 200 (with the CABAC unit 530 and decoding system 200 used interchangeably below in association with FIGS. 6A-6F), and hence the decoding system 200 is configured to decode a single bitstream in the illustrated embodiment. Similar principles apply to decoding systems 200 with additional CABAC units used to simultaneously decode multiple (e.g., two) streams. Briefly, FIG. 6A is a block diagram of select components of the decoding system 200, and FIG. 6B is a functional block diagram of the select components shown in FIG. 6A in addition to other components. In addition, FIG. 6C is a block diagram that illustrates the stream buffer functionality provided by the decoding system 200; FIGS. 6D and 6F are block diagrams that illustrates context memory functionality of the decoding system 200; and FIG. 6E is a block diagram that illustrates an exemplary mechanism employed in decoding of a macroblock. It should be appreciated that although the below description is set forth in the context of macroblock decoding, the principles set forth herein also may be applied to variations in block decoding.

Referring to FIG. 6A, the decoding system 200 comprises the CABAC unit 530, which comprises CABAC logic module 660 and memory module 650. The CABAC logic module 660 comprises, in one embodiment, three hardware modules, including a binarization (BIND) module 620, a get context (GCTX) module 622, and a binary arithmetic decoding (BARD) engine 624 in the CABAC unit 530. The BARD engine 624 further comprises a state index (pStateIdx) register 602, MPS value (valMPS) register 604, code length range (codlRange) register 606, and code length offset (codlOffset) register 608. The CABAC unit 530 further comprises a memory module 650, which includes a macrbblock neighbor context (mbNeighCtx) memory 610 (also referred to herein as a context memory array), a local register 612, a global register 614, and an SREG-stream buffer/DMA engine 618 (also referred to herein as a DMA engine module, as explained further in association with FIG. 6C), in addition to other registers not shown. In one embodiment, the mbNeighCtx memory 610 comprises an array structure, as shown in FIG. 6D and explained further below. The memory module 650 also comprises a binstring register 616.

The CABAC unit 530, at its interface to the rest of the execution unit 420a, includes a destination (DST) bus 628, two source buses, SRC1 632 and SRC2 630, a command and thread information bus 634, and a stall/reset bus 636. The data on the destination bus 628 may be communicated, directly or indirectly (e.g., through an intermediary cache, register(s), buffers, or memory), to a video processing unit internal or external to the GPU 114. The data on the destination bus 628 may be formatted in one of a plurality of different formats, including DX API formats of MICROSOFT, among others. Such data may include coefficients, macroblock parameters, motion information, and/or IPCM samples, among other data. The CABAC unit 530 also includes a memory interface that comprises an address bus 638 and data bus 640. The memory interface enables access to bitstream data by providing an address via the address bus 638 for access to data received on the data bus 640. In one implementation, data on the data bus 640 may include a non-encrypted video stream comprising various signal parameters, among other data and formats. In some embodiments, a load-store operation can be used to provide access to the bitstream data.

Before commencing description of the various components of the CABAC unit 530, a brief overview is presented that relates CABAC decoding to the overall operation of the execution unit 420a. In general, based on the slice type, the driver software 128 (FIG. 1) prepares and loads a CABAC shader to the execution unit 420a. This CABAC shader uses standard instruction sets plus BIND, GCTX and BARD instructions to decode a bitstream. Since the context table used by the CABAC unit 530 may change depending on the slice type, loading occurs for each slice. In one embodiment, the first instructions executed by the CABAC shader include an INIT_CTX and INIT_ADE before other instructions are issued. These two latter instructions, explained further below, initialize the CABAC unit 530 to decode a CABAC bitstream and load the bitstream into a FIFO buffer from which point the stream decoding is managed automatically.

With regard to the parsing of the bitstream, the bitstream is received at the memory interface over the data bus 640 and buffered at the SREG-stream buffer/DMA engine 618. Bitstream decoding is provided from the stage of slice data parsing. That is, a bitstream, such as an NAL bitstream, comprises one or more pictures that are broken-up into a picture header and slices. A slice generally refers to a sequence of macroblocks. In one embodiment, an external process (i.e., external to the CABAC unit 530) parses the NAL bitstream, decoding the slice header and passing on the pointer to the location of the slice data (e.g., where the slice starts). The hardware (plus software) is capable of parsing the H.264 bitstream from the picture level. However, in one embodiment, CABAC coding is only present from the slice data and macroblock level. Generally, the driver software 128 processes the bitstream from slice data level because of the expectation of the applications and the APIs provided. The passing along of the pointer to the location of the slice data involves the address of the first byte of the slice data (e.g., RBSPbyteAddress) and a bit offset indicator (e.g., one or more bits) to indicate the position of the start or head of the bitstream (e.g., sREGptr). This initialization of the bitstream is explained further below. In some embodiments, the external process may be implemented by a host processor (e.g., CPU 126, FIG. 1) to provide for picture-level decoding and slice-header decoding. In some embodiments, due to the programmable nature of the decoding system 200, decoding may be implemented at any level.

Referring to FIG. 6C, shown is a block diagram that illustrates select component parts of the SREG-stream buffer/DMA engine 618 and other components of the CABAC unit 530, including operand registers 662 and 664 for receiving SRC1 and SRC2 values on buses 632 and 630, respectively, and forwarding registers 666 and 668. Other components are shown and described in association with FIG. 6A, and hence discussion of the same is omitted for brevity except where helpful to the description below. The SREG-stream buffer/DMA engine 618 comprises an internal bitstream buffer 618*b* that in one embodiment includes a 32-bit register and eight 128-bit (8×128) registers configured in, for instance, BigEndian format. The SREG-stream buffer/DMA engine 618 is initially set-up through the driver software 128 issuing an initialization instruction as explained below. Once initiated, the internal buffer 618*b* of the SREG-stream buffer/DMA engine 618 is largely managed automatically. The SREG-stream buffer/DMA engine 618 is used to maintain the location of the bits to be parsed. The SREG-stream buffer/DMA engine 618 in one embodiment uses two registers, a fast 32-bit flip-flop and slower 512 or 1024 bit memory. The bitstream is consumed in bits. The sREG register 618*a* (herein, also simply sREG) operates on the bit level and the bitstream buffer 618*b* on the byte level, which helps to save on power. In general, instructions operate on the sREG register 618*a* and consume a few bits (e.g., 1-3 bits). When more than one byte of data has been consumed from the sREG register 618*a*, then data (in byte chunks) is provided to the SREG register 618*a* from the bitstream buffer 618*b*, and a buffer pointer is decremented by the number of bytes transferred. When 256-bits or more have been consumed, then the DMA of the SREG-stream buffer/DMA engine 618 detects this event, and fetches 256-bit from memory to refill the bitstream buffer 618*b*. Thus, a simple circular buffer (256-bit chunks×4) is implemented by the CABAC unit 530 to keep track of the bitstream buffer 618*b* and provide replenishment. In some embodiments, a single buffer may be used, however typically at the expense of implementing a circular buffer with more complex pointer arithmetic at the speed of the memory.

Interaction with the internal buffer 618*b* may be accomplished through the use of an initialization instruction, herein referred to as an INIT_BSTR instruction. In one embodiment, the INIT_BSTR instruction, as well as the other instructions described below, are issued by the driver software 128. Given the byte address and the bit-offset of the bitstream location, the INIT_BSTR instruction loads the data into the internal bitstream buffer 618*b* and starts the process of managing it. For each call to process slice data, the following instruction with the following format is issued:

INIT_BSTR offset, RBSPbyteAddress

This instruction is issued to load the data into the internal buffer 618*b* of the SREG-stream buffer/DMA engine 618. The byte address (RBSPbyteAddress) may be provided via the SRC2 register 664 and the bit offset via the SRC1 register 662. Thus, one generic instruction format may be provided as follows:

INIT_BSTR SRC2, SRC1, where SRC1 and SRC2 in this instruction, and others provided below, correspond to values within internal registers 662 and 664, though not limited to these registers. The memory fetch used to access the bitstream data, in one embodiment, is 256-bit aligned, which is written into buffer registers and transferred to the 32-bit SREG register 618*a* of the SREG-stream buffer/DMA engine 618. In one implementation, data in the bitstream buffer 618*b* is byte-aligned before any other operations on these registers or buffers can be performed. The alignment of the data may be implemented through the use of an alignment instruction, referred to herein as an ABST instruction. The ABST instruction aligns the data in the bitstream buffer 618*b*, where alignment bits (e.g., stuffed bits) are eventually discarded during the decoding process.

As data is consumed from the SREG register 618*a*, it is replenished by the internal buffer 618*b*. In other words, the internal buffer 618*b* of the SREG-stream buffer/DMA engine 618 acts as a circular buffer of modulo three that feeds the 32-bit register 618*a* of the SREG-stream buffer/DMA engine 618. The CABAC logic 660 may utilize a READ instruction to read data from the SREG register 618*a*. The READ instruction may have the following format:

READ DST, SRC1, where DST corresponds to an output or destination register. In one embodiment, the SRC1 register 662 comprises an unsigned integer value, n. That is, under the READ instruction, n-bits are read from the sREG register 618*a*. When 256-bits of data are consumed (e.g., when one or more syntax elements are decoded) from the 32-bit register 618*a*, a fetch is automatically initiated to get another 256-bit of data to write to registers in the internal buffer 618*b* for subsequent entry into the SREG register 618*a* for consumption.

In some embodiments, if the data in the SREG register 618*a* corresponding to a symbol decode has been consumed to a pre-defined number of bits or bytes, and no data has been received in the internal buffer 618*b*, the CABAC logic 660 can implement a stall via a stall/reset bus 636, enabling the execution of another thread (e.g., a thread unrelated to CABAC decoding processing), such as for a vertex shader operation.

The operations of the DMA engine of the SREG-stream buffer/DMA engine 618 minimize total buffer requirements to compensate for memory latency (e.g., can be 300 plus cycles in some graphics processor units). As a bitstream is consumed, requests are made to stream-in further bitstream data. If the bitstream data is low and the bitstream buffer 618*b* at risk of underflow (e.g., given the number of cycles for signals to flow from the CABAC unit 530 to the processor pipeline), stall signals can be passed to the processor pipe to cause a halt in operations until data arrives in the bitstream buffer 618*b*.

Additionally, the SREG-stream buffer/DMA engine 618 inherently provides an ability to handle a corrupted bitstream. For instance, it is possible that, due to corruption of the bitstream, end-of-slice markers may not be detected. Such failure in detection can result in a completely wrong decode result and consumption of bits from future pictures or slices. The SREG-stream buffer/DMA engine 618 keeps track of the number of bits consumed. If the number of bits consumed is larger than a defined (e.g., programmable per slice) amount or threshold, then processing stops and an exception signal is sent to the processor (e.g., host processor). Code can then be executed on the processor to attempt to recover from the corruption.

With continued reference to FIG. 6A, FIG. 6B provides a further illustration of the functionality of the CABAC unit 530, and in particular, the initialization of the decoding engine (i.e., BARD engine or module 624) and the context variables. At the start of a slice and before decoding a syntax element corresponding to a first macroblock, the context states and the BARD module 624 are initialized. In one embodiment, this initialization is performed upon issuance by the driver software 128 using two instructions, INIT_CTX and INIT_ADE.

The INIT_CTX instruction effects commencement of a CABAC decoding mode and initializes one or more context tables (e.g., stored remotely or in on-chip memory, such as ROM). The INIT_CTX instruction may be implemented according to the following exemplary instruction format:

INIT_CTX SRC2, SRC1

For the INIT_CTX instruction, operand SRC1 can take on the following values, one or more of which pertain to known H.264 macroblock parameters, depending on the bit location: cabac_init_idc, mbPerLine, constrained_intra_pred_flag, NAL_unit_type (NUT), and MbaffFlag. Note that constrained_intra_pred_flag, NAL_unit_type (NUT), and MbaffFlag correspond to known H.264 macroblock parameters. In addition, operand SRC2 can take on the following values depending on the bit location: SliceQPY, and mbAddrCurr. Explaining further, for the execution of the INIT_CTX instruction (i.e., initialization of the CABAC context table), in one embodiment, the cabac_init_idc and sliceQPY (e.g., quantization) parameters are needed. However, to initialize the entire CABAC engine, three instructions are utilized, namely:

INIT_BSTR, INIT_CTX and INIT_ADE. Thus, bits available in the SRC1, SRC2 (e.g., 64-bits total, or 32-bits each) are used to pass the other parameters which are used for the working of the CABAC neighborhood context. Thus, the two source registers SRC1 662 and SRC2 664 may contain the following values:

SRC1[15:0]=cabac_init_idc

SRC1[23:16]=mbPerLine

SRC1[24]=constrained_intra_pred_flag

SRC1[27:25]=NAL_unit_type (NUT)

SRC1[28]=MbaffFlag

SRC1[31:29]=Undefined

SRC2[15:0]=SliceQPY

SRC2[31:16]=mbAddrCurr

The SliceQPY value is used to initialize a state machine (not shown) implemented in the bitstream buffer 618*b*.

Although the various aforementioned parameters are known as picture and slice level parameters, additional discussion for a few of the parameters specific to the CABAC unit 530 is provided below. In one embodiment, cabac_init_idc is defined for slices which are not coded as an I-picture (I) and switching I picture (SI). In other words, cabac_init_idc may be defined only for P and SP and B-slices, and when I and SI slices are received, a default value is provided for cabac_init_idc. For instance, in an implementation where approximately 460 contexts are initialized (e.g., for I and SI slices), cabac_init_idc may be set to three (3) (e.g., since according to the H.264 specification, cabac_init_idc may only have values 0 . . . 2), enabling two bits to indicate that the slice is I or SI.

The INIT_CTX instruction is also used by the CABAC unit 530 to initialize the local register 612 and mbNeighCtx 610 array structures or elements, including registers pertaining to the temporary storage of spatially adjacent macroblocks. Referring to FIG. 6D, one embodiment of the mbNeighCtx memory 610 is shown at the top of the diagram. The mbNeighCtx memory 610 comprises a macroblock-based neighborhood context memory arranged in one embodiment as a memory array to store data relating to a row of macroblocks. The mbNeighCtx memory 610 is shown as comprising array elements mbNeighCtx[0, 1, i−1, i, i+1, . . . 119] 601, each element for storing one of 120 macroblocks in a row (e.g., corresponding to HDTV at 1920×1080 pixels). Also shown are registers mbNeighCtxCurrent 603 for storing a currently decoded macroblock, and mbNeighCtxLeft 605 for storing a previously decoded, neighboring (left) macroblock. Additionally, the registers 603, 605 and array element 601 are referenced using pointers 607*a*, 607*b*, and 607*c* (represented symbolically by an arrow in FIG. 6D). To decode a current macroblock, the decoded data is stored in mbNeighCtxCurrent 603. Given the contextual nature of CABAC decoding, decoding of the current macroblock is based on information gleaned from previously decoded macroblocks, namely the left macroblock stored in mbNeighCtxLeft 605 and pointed to by pointer 607*b* and the top macroblock stored in the array element (referenced as "i") 601 and pointed to by pointer 607*c*.

Continuing with an explanation of the initialization instruction, the INIT_CTX instruction is used to initialize top and left pointers 607*c* and 607*b* pertaining to macroblocks adjacent to the current macroblock (e.g., elements in the array of mbNeighCtx memory 610). For instance, the left pointer 607*b* may be set to zero (0) and the top pointer 607*c* at mbPerLine may be set to one (1). Additionally, the INIT_CTX instruction updates the global register 614.

With regard to the initialization of a context table, responsive to a call to INIT_CTX, the CABAC unit 530 sets up one or more context tables, also referred to as a CTX_TABLE(s). In one embodiment, the CTX_TABLE may be configured as a 4×460×16-bit (8-bits for m and another 8-bits for n, signed values) table or other data structure. Each entry of the CTX_TABLE comprises values for pStateIdx and valMPS accessed from registers pStateIdx 602 and valMPS 604.

The INIT_ADE instruction initializes the BARD module 624, also referred to herein as a decoder engine. In one implementation, the call to INIT_ADE is made subsequent to the completion of an INIT_BSTR instruction. As a result of the execution of the INIT_ADE instruction, the CABAC unit 530 sets up the two registers, codIRange 606 and codIOffset 608, with the following instructions or values:

codIRange=0x01FE, and codIOffset=ZeroExtend (READ(#9),#16)

Thus, in one embodiment, both of these variables may be held as 9-bit values. Referring to the codIOffset instruction, 9-bits are read from the bitstream buffer 618*b* and zero-extended for storage in, for instance, the 16-bit codIOffset register 608. Other values may be used in some embodiments. The BARD module 624 uses the values stored in these registers 606, 608 to determine whether to output a zero (0) or one (1), and after the decoding of a given bin, these values are updated.

In addition to initializing the codIRange 606 and codIOffset 608 registers, the INIT_ADE operation also initializes the binstring register 616. In one embodiment, the binstring register 616 may be configured as a 32-bit register that receives each output bit from the BARD module 624. In some embodiments, other register sizes may be used.

The BARD module 624 is also initialized when a macroblock is coded I_PCM. As is known, I_PCM data comprises pixel data where no transformation or prediction model has been applied to the raw video data according to the H.264 specification. For instance, I_PCM may be used for lossless coding applications Having described the architecture and instructions involved in the parsing of the bitstream and the initialization of various decoding system components, one or more processes involved in binarization, obtaining of model information and a context, and decoding based on the model and context is described below. In general, the CABAC unit 530 is configured to obtain all possible binarizations for the parsed syntax element (SE), or at least enough to obtain model information, through the BIND module 620 and BIND instruction. The CABAC unit 530 further obtains a context for the given syntax element via the GCTX module 622 and GCTX instruction, and implements arithmetic decoding based on the context and model information via the BARD module 624 and BARD instruction. In effect, a loop is implemented on calls to GCTX/BARD instructions, outputting one bit to the binstring register 616 until a meaningful codeword match for a given syntax element is found. That is, in one embodiment, every time a bin is decoded, a corresponding decoded bit is provided to the binstring register 616, and the binstring register is read back to the GCTX module 622 until a match is found.

Explaining the decoding system architecture in more detail in the context of a single CABAC unit 530, and with continued reference to FIGS. 6A and 6B, the BIND module 620 is enabled through a BIND instruction issued by the driver software 128. In one embodiment, the BIND instruction comprises the following exemplary format:

BIND DST, #Imm6, SRC1, where DST corresponds to DST register 652, and #Imm16 corresponds to 16-bit immediate value and SRC1 correspond to input register SRC1 662. The input to the BIND operation comprises a syntax element (SE), which comprises a 16-bit immediate value, "Imm", and a context block category (ctxBlockCat). The syntax element may comprise any of well-known syntax element types as defined under the H.264 standard (e.g., MBTypeInI, MBSkipFlagB, IntraChromaPredMode, etc.). A call to the BIND instruction results in the driver software 128 reading the syntax element from a table (or other data structure) stored in memory (e.g., on-chip or remote memory) and obtaining a syntax element index (SEIdx). The syntax element index is used to access other tables or data structures to obtain various macroblock parameters as described below.

The DST register 652 comprises, in one embodiment, a 32-bit register having the following format: bits 0-8 (ctxIdxOffset), bits 16-18 (maxBinIdxCtx), bits 21-23 (ctxBlockCat), bits 24-29 (ctxIdxBlockOffset), and bit 31 (bypass flag). These values (e.g., ctxIdxOffset, maxBinIdxCtx, etc.) are passed to the GCTX module 622 for use in context modeling. Any remaining bits are undefined and may be read as zero in this particular implementation. The ctxIdxBlockOffset may be derived through a table, or other data structure, stored remotely or in on-chip memory, based on matching the same with the syntax element index and ctxBlockCat. A representation of the content in such a table is illustrated as a non-limiting example in Table 1 below:

TABLE 1

| codeNum (k) | Coded_block_pattern | |
|---|---|---|
| | Intra_4x4 | Inter |
| 0 | 47 | 0 |
| 1 | 31 | 16 |
| 2 | 15 | 1 |
| 3 | 0 | 2 |
| 4 | 23 | 4 |
| 5 | 27 | 8 |
| 6 | 29 | 32 |
| 7 | 30 | 3 |
| 8 | 7 | 5 |
| 9 | 11 | 10 |
| 10 | 13 | 12 |
| 11 | 14 | 15 |
| 12 | 39 | 47 |
| 13 | 43 | 7 |
| 14 | 45 | 11 |
| 15 | 46 | 13 |
| 16 | 16 | 14 |
| 17 | 3 | 6 |
| 18 | 5 | 9 |
| 19 | 10 | 31 |
| 20 | 12 | 35 |
| 21 | 19 | 37 |
| 22 | 21 | 42 |
| 23 | 26 | 44 |
| 24 | 28 | 33 |
| 25 | 35 | 34 |
| 26 | 37 | 36 |
| 27 | 42 | 40 |
| 28 | 44 | 39 |
| 29 | 1 | 43 |
| 30 | 2 | 45 |
| 31 | 4 | 46 |
| 32 | 8 | 17 |
| 33 | 17 | 18 |
| 34 | 18 | 20 |
| 35 | 20 | 24 |
| 36 | 24 | 19 |
| 37 | 6 | 21 |
| 38 | 9 | 26 |
| 39 | 22 | 28 |
| 40 | 25 | 23 |
| 41 | 32 | 27 |
| 42 | 33 | 29 |
| 43 | 34 | 30 |
| 44 | 36 | 22 |
| 45 | 40 | 25 |
| 46 | 38 | 38 |
| 47 | 41 | 41 |

If a received ctxBlockCat is undefined, the CABAC unit 530 may treat such an undefined parameter as zero, such that the ctxIdxBlockOffset is considered to have a zero value.

A call to BIND also results in a reset signal (e.g., Rst_Signal) being sent out to the BARD module 624 from the BIND module 620, as explained further below.

Given the explanation of the various inputs to and outputs from the BIND module 620, operation of the BIND module 620 according to at least one embodiment is now set forth. Given a call to the BIND module 620, the BIND module 620 extracts the syntax element and through software is provided the given syntax element index (SEIdx). Using the syntax element index, the BIND module 620 performs a table lookup to obtain corresponding values for maxBinIdxCtx, ctxIdxOffset, and bypassFlag. These looked-up values are temporarily stored in predefined bit allocations in DST register 652. Additionally, using the syntax element index and the ctxBlockCat, the BIND module 620 performs a second table lookup (e.g., in remote or on-chip memory) to obtain a value for ctxIdxBlockOffset. This second looked-up value is also temporarily stored in the DST register 652. Thus, the determined values are used to construct the DST register 652 for use as a 32-bit value output destination.

For some syntax elements, additional information (in addition to the syntax element and ctxBlockCat) may be used to enable H.264 decoding operations. For instance, for macroblock parameters such as SigCoeffFlag and lastSigCoeffFlag, the value in array element mbNeighCtx [1] of the mbNeighCtx 610 and the input ctxBlockCat value are used to determine whether the macroblock is field or frame coded. Note that there exists different coding for sigCoeffFlag and lastSigCoeffFlag depending on whether the picture is field or frame coded. In certain embodiments, the same syntax element number is used for these flags even though they are different, and then the mb_field_decoding_flag (mbNeighCtx [1] field) is used to distinguish between them.

In addition to the functionality presented above in association with the BIND module 620, it is noted from FIG. 6B that the BIND module 620 works in conjunction with a binIdx register 654 and multiplex unit 656 and/or forwarding registers 666 and/or 668 (e.g., one shown in FIG. 6B, represented as F1). With regard to the binIdx register 654 and multiplex unit 656, based on various input, the multiplex unit 656 provides an output SRC1 (e.g., the value in temporary register SRC1) to the GCTX module 622.

With regard to the forwarding registers, such as that represented by F1, when the BIND (or GCTX) instructions produce a result, the result may be written to both a destination register, such as the DST register 652, and/or to a forwarding register 666, 668, such as represented by F1. Whether an instruction, and hence corresponding module (e.g., GCTX module 622 or BARD module 624), uses a forwarding register 666, 668 is indicated by forwarding flags in the given instruction. Symbols to represent the forwarding registers 666, 668 may include F1 666 (i.e., forwarded source 1 value is to be used, which in one embodiment may be indicated by bit 26 in the instruction) and F2 668 (i.e., forwarded source 2 value is to be used, which in one embodiment may be indicated by bit 27 in the instruction). For the GCTX module 622 and the BARD module 624, the data may be forwarded to their respective input as explained further below.

Given the above-description of the BIND module 620 and related processes, the obtaining of a context for a given model and bin index is set forth below with regard to the GCTX module 622 under the direction of the GCTX instruction. Briefly, the input to the GCTX module 622 includes maxBinIdxCtx, binIdx, and CtxIdxOffset, as described below. The GCTX module 622 uses the CtxIdxOffset and binIdx values to compute a CtxIdx value (an output, which is a context Index).

One exemplary format for the GCTX instruction comprises the following:

GCTX DST, SRC2, SRC1, where SRC1 corresponds to the value output from the multiplex unit 656 and stored in temporary register SRC1 662, SRC2 corresponds to the values output from the DST register 652 and stored in temporary register SRC2 664, and DST corresponds to a destination register. In one embodiment, the various registers may take on the following values:

SRC1 [7:0]=binIdx; that is, the value provided in SRC1 (output from the multiplex unit 656 and hence used as an input of the GCTX module 622) may be the value in the binIdx register 654 if the current syntax element comprises a codedBlockPattern.

SRC1 [15:8] may be levelListIdx when computing sigCoeffFlag, lastSigCoeffFlag, or mbPartIdx when computing Ref_Idx or binIdx for a coded block pattern. That is, the multiplex unit 656 may be used to convey levelListIdx when the syntax element is either the sigCoeffFlag or lastSigCoeffFlag.

SRC1 [16] may contain an iCbCr flag, and when zero (0), the block is a Cb chroma block. Additionally, SRC1 [16] may contain the value L0/L1, and when L0, the value is zero (0). As would be understood by one having ordinary skill in the art in the context of the present disclosure, L0/L1 refer to the picture reference lists (L0=list0, L1=list1) used in motion compensation prediction.

SRC1 [21:20]=mbPartitionMode
SRC2 [8:0]=ctxIdxOffset
SRC2 [18:16]=maxBinIdxCtx
SRC2 [23:31]=ctxBlockCat
SRC2 [29:24]=ctxIdxBlockOffset
SRC2 [31]=bypassFlag Further, DST comprises the output of the GCTX module 622, and takes on the following values:

DST [15:00]=ctxIdx
DST [23:16]=binIdx
DST [27:24]=mbPartIdx
DST [29:28]=mbPartitionMode
DST [30]=L0

The GCTX module 622 may also interact with forwarding registers, and hence instructions where forwarding registers are used may take on the format of GCTX.F1.F2, where F1 and F2 indicates forwarding registers 666, 668 are used, respectively. That is, there are two bits in the instruction coding (F1 and F2). If one or both of the forwarding flags are missing, this absence indicates which forwarding register is not utilized. If these bits are set (e.g., set to 1), then the forwarded register value (value generated internally) is used. Otherwise, the source register value is used. Thus, this forwarding register feature provides a hint to the compiler as to when the earliest the instruction may be issued. If forwarding is not used, then the instruction may experience read-after-write latency of the given source register.

For the GCTX instruction, if the reset signal Rst_Signal is set, then the SRC1 value is 0. If (F1 & rst_signal), then the binIdx value from inside the GCTX unit 622 but incremented by 1 is SRC1, otherwise SRC1 is the binIdx value from an EU register. The output of the BIND module 620 may be used as a forwarded SRC2 value for both the GCTX and BARD instructions. In this latter instance, a BIND instruction may not be issued until the BARD instruction has consumed the forwarded register. Explaining further, the Rst_Signal and the F1 forwarding signal are combined into a single (e.g., 2-bit signal) signal as {F1,reset} that dictates whether the SRC1 value input to the GCTX module 622 comprises the binIdx value or the forwarded value. Another effect of providing the Rst_Signal is that the binString 616 is cleared and reset, and the binIdx register 654 is reset to zero.

Continuing the discussion of the GCTX module 622 and obtaining context information, in one embodiment, the following information shown below in Tables 2 and 3 correspond to the values for structures mbNeighCtx memory 610 and register mbNeighCtxCurrent 603, respectively. The mbNeighCtxCurrent 603, as explained above, contains the decoding output result of a current macroblock. At the end of processing a current macroblock, a CWRITE instruction is issued, which copies information from mbNeighCtxCurrent 603 to the corresponding location in the mbNeighCtx memory 610 array. Such copied information is used later as the top neighborhood values.

TABLE 2

| Parameter | | Size (bits) |
|---|---|---|
| transform_size_8x8_flag | 1 | 0 |
| mb_field_decode_flag | 1 | 1 |
| mb_skip_flag | 1 | 2 |
| Intra_chroma_pred_mode | 2 | 4:3 |
| mb_type | 3 | 7:5 |
| codedBlockPatternLuma | 4 | 11:8 |
| codedBlockPatternChroma | 2 | 13:12 |
| codedFlagY | 1 | 14 |
| codedFlagCb | 1 | 15 |
| codedFlagCr | 1 | 16 |
| codedFlagTrans | 8 | 24:17 |
| refIdx | 8 | 32:25 |
| predMode | 4 | 36:33 |

TABLE 3

| Parameter | | Size (bits) |
|---|---|---|
| transform_size_8x8_flag | 1 | 0 |
| mb_field_decode_flag | 1 | 1 |
| mb_skip_flag | 1 | 2 |
| Intra_chroma_pred_mode | 2 | 4:3 |
| mbQpDeltaGT0 | 1 | 88 |
| codedBlockPatternLuma | 4 | 11:8 |
| codedBlockPatternChroma | 2 | 13:12 |
| codedFlagY | 1 | 14 |
| codedFlagCb | 1 | 15 |
| codedFlagCr | 1 | 16 |
| codedFlagTrans | 24 | 87:64 |
| refIdx | 16 | 52:37 |
| predMode | 8 | 60:53 |
| mb_type | 3 | 63:61 |

The codedFlagTrans, in one embodiment, is divided into three sections. For instance, the first 4-bits relate to when ctxBlockCat is 0 or 1, the upper 4-bits relate to when ctxBlockCat is either 3 or 4. The upper 4-bits are further divided into two parts, with the lower 2 bits for iCbCr=0 and the other 2 bits for iCbCr=1. The predMode (prediction mode) has one of the following three options: predL0=0, predL1=1, NiPred=2.

One embodiment of a structure for refIdx referenced in Tables 2 and 3 above is shown in FIG. 6E. Note that refIdx refers to the index to the list of reference pictures used in the reconstruction of a picture. Such a structure provides for an optimization in terms of memory and logic. As shown, the refIdx structure comprises a top row of macroblocks 609, macroblock partitions 611 (e.g., four shown), L0/L1 values 613, and stored bit values Gt0 (greater than 0) 615 and Gt1 (greater than 1) 617 for each L0 and L1 value. In general, access is needed to the top neighbor macroblock 609, though all that is required is the bottom row of the macroblock, which has been subdivided in one embodiment into 4×4 squares, resulting in four mbPartitions 611. For each partition 611, knowledge of the values for L0/L1 613 is to be ascertained, but not the actual values. That is, a determination is made as to whether the L0 and L1 values are either 1 or larger than 1. In one embodiment, this determination is achieved by storing two bits: Gt0 615 and Gt1 617, which are used in the calculation of syntax elements (refIdx).

Explaining the benefit of the refIdx structure further, two optimizations are performed. In one optimization, only 2-bits are held (although the reference value is typically larger), and more bits are unnecessary for the decoding of refIdx in the CABAC unit 530. The full value is decoded and held in an EU register or memory (e.g., L2 cache 408). A second optimization is that only four elements are held (e.g., two on the left and two on the top). These four elements are recycled and the final values are written to the neighbors by the CWRITE instruction, which saves in memory since only 16 bits are held in the mbNeighCtxCurrent register 603 and only 8-bits in the mbNeighCtxLeft register 605 and the top mbNeighCtx element 601 of the array 610. Further savings are realized in computation logic since full arithmetic for the decoded reference values is replaced by few-bit Boolean operations.

The mb_type of interest comprises the following shown in Table 4 below:

TABLE 4

| Mb_type | Name |
|---|---|
| 4'b000 | SI |
| 4'b001 | I_4x4 or I_NxN |
| 4'b010 | I_16x16 |
| 4'b011 | I_PCM |
| 4'b100 | P_8x8 |
| 4'b101 | B_8x8 |
| 4'b110 | B_Direct_16x16 |
| 4'b111 | Others |

Additional registers not shown in, or discussed in association with, FIG. 6B may be used, such as mbPerLine (e.g., 8-bit unsigned), mb_qp_delta (8-bit signed), and mbAddrCurr (16-bit, current macroblock address). Note that for mbAddrCurr, a 1920×1080 array is implemented, where although only 13-bits are needed, some embodiments may use 16-bits to facilitate performance of 16-bit arithmetic.

The values from the above-described registers (e.g., mbPerline, mbAddrCurr and mb_qp_delta) are also stored in the global register 614. That is, copies of these values stored in the global register 614 are stored in registers to facilitate hardware design. The global register 614 comprises, in one embodiment, a 32-bit register formatted to include values corresponding to mbPerline, mbAddrCurr and mb_qp_delta, in addition to other values corresponding to NUT, MBAFF_FLAG, and chroma_format_idc.

The various fields in the global register 614 may be updated using an INSERT instruction. An exemplary format for the INSERT instruction may be as follows:

INSERT DST, #Imm, SRC1

In the above INSERT instruction, one embodiment for #Imm comprises a 10-bit number, where the first 5-bit width of the data and the upper 5-bits specify the position where the data is to be inserted. Input parameters include the following:

Mask=NOT(0xFFFFFFFF<<#Imm[4:0])
Data=SRC1 & Mask
SDATA=Data<<#Imm[9:5]
SMask=Mask<<#Imm[9:5]

The output, DST, can be represented as follows:
DST=(DST & NOT(sMask))|SDATA

Note that at least some of the fields (e.g., NUT (NAL_UNIT_TYPE), C (constrained_intra_pred_flag), MBAFF_FLAG, mbPerLine and mbAddrCurr values may also be written/initialized to the global register 614 using the INIT_CTX instruction.

The local register 612 comprises, in one embodiment, a 32-bit register having fields corresponding to b, mb_qp_delta, numDecodAbsLevelEq1, and numDecodAbsLevelGt1. These fields may be updated using the INSERT instruction. The local register 612 is also initialized such that b=0, mb_qp_delta=0, numDecodAbsLevelEq1=−1 and numDecodAbsLevelGt1=0. One instruction for providing this initialization can be implemented using the following format:

CWRITE SRC1, where SRC1 [15:0]=mbAddrCurr. CWRITE SRC1 updates the mbAddrCurr field in the global register 614. Additional functionality provided through the CWRITE instruction is described below after a brief discussion of the neighboring elements structures and their use in decoding.

In CABAC decoding, syntax values are predicted and/or modeled from their neighboring macroblocks (e.g., left, top). Various methods are described below that provide how certain embodiments of the CABAC unit 530 determine the left and top neighboring macroblocks and how such embodiments determine whether these macroblocks are actually available. The mbPerLine parameter is used in the symbol decoding stage. As explained above, the decoding process uses neighboring values (e.g., from the macroblock or block to the above and to the left). In one embodiment, the BARD module 624 computes the following equations below, using the current macroblock number and the number of macroblocks on a line (mbPerLine) to calculate the top macroblock address and whether the left and above macroblocks are available.

For instance, to determine whether an adjacent macroblock (e.g., left neighbor) is present (i.e., valid), an operation (e.g., mbCurrAddr % mbPerLine) may be performed to check whether the result is zero. In one embodiment, the following computations may be performed:

$$a = (mbCurrAddr \% mbPerLine)$$
$$a = mbCurrAddr - \left\lfloor \frac{mbCurrAddr}{mbPerLine} \right\rfloor \times mbPerLine$$

Note that mbCurrAddr refers to the current macroblock location corresponding to the binary symbols to be decoded, and mbPerLine refers to the amount of macroblocks per a given row. The above computation is implemented using one divide, one multiply, and one subtract.

As a further illustration of the decoding mechanisms implemented by the BARD module 624, reference is made to FIG. 6F, which shows a picture that is to be decoded (16×8 macroblocks, and hence mbPerLine=16). If thirty-five (35) macroblocks are decoded (mbCurrent is labeled 35, the thirty-sixth macroblock, which has not yet been fully decoded), this requires data from the previously decoded top macroblock (labeled 19) and the left macroblock (labeled 34). The top macroblock information can be obtained from the mbNeighCtx[i], where i=mbCurrent % mbPerLine. Thus, for this example, i=35%16, which equals 3. After the current macroblock has been decoded, the CWRITE instruction can be used to update the mbNeighCtxLeft 605 and mbNeighCtx[i] 601 in the array.

As another example, consider the following:
mbCurrAddre[0:max MB−1], with maxMB being 8192 and mbPerLine=120. In one embodiment, the divide can be performed with a multiply with (1/mbPerLine) being looked up in a table (e.g., a 120×11-bit table) stored in on-chip memory. If the mbCurrentAddr is say, 13-bits, a 13×11-bit multiplier may be used. In one embodiment, the result of this multiply operation is rounded, the upper 13-bits are stored, and 13×7-bit multiply is performed, whereby the lower 13-bits are stored. Finally, a 13-bit subtract operation is performed to determine "a." The entire sequence of operations may take two (2) cycles, and the result may be stored to be utilized in other operations, and computed once when the mbCurrAddr value changes.

In some embodiments, the modulo computation is not performed, but instead, shader logic in the execution unit (e.g., EU 420a, 420b, etc.) is used to supply the first mbAddrCurr value aligned to lie in the first line of the slice. For example, such shader logic may perform the following calculation: mbAddrCurr=absoluteMbAddrCurr−n*mbPerLine. That is, because there are some very complex neighborhood structures for some H264 flexible macroblock ordering (FMO) modes, to cope with these modes, the left/top availability can be computed in an additional shader of the decoding system 200 and loaded to one or more registers serving the CABAC unit 530. By "off-loading" the CABAC unit 530, complexity of the hardware is reduced while enabling all H264 modes to be supported for symbol decoding.

The CWRITE instruction copies appropriate fields from mbNeighCtxCurrent 603 to mbNeighCtxTop[ ] 601 and mbNeighCtxLeft[ ] (e.g., the left macroblock in the array 610). The particular mbNeighCtxTop[ ] 601 and mbNeighCtxLeft[ ] data written to depends on whether the mBaffFrameFlag (MBAFF) is set and whether the current and previous macroblocks are field or frame coded. When (mbAddrCurr % mbPerLine==0) then mbNeighCtxLeft 605 is marked as being unavailable (e.g., it is initialized to zero). The contents of the mbNeighCtx memory 610, local register 612, and global register 614 may be "moved" using CWRITE instructions. For instance, the CWRITE instructions move the relevant content of mbNeighCtx memory 610 to the left and top block of the $i^{th}$ macroblock (e.g., mbNeighCtx[i] or current macroblock), and also clears the mbNeighCtx register 603. That is, as explained above, associated with the mbNeighCtx memory 610 are two pointers: left point 607b and top pointer 607c. After a CWRITE instruction, the top index is incremented by one and the content of the current macroblock is moved to the top position and also to the left position in the array. The aforementioned organization may reduce the number of read/write ports on this memory array to one read/write.

The contents of the mbNeighCtx memory 610, local register 612, and global register 614 may be updated using INSERT instructions, as described above. For instance, the current macroblock may be written using an INSERT instruction (e.g., INSERT $mbNeighCtxCurrent_1, #Imm10, SRC1). This latter operation does not affect the left 607b and top 607c pointers (i.e., only writes to the current position).

The INSERT instruction and updates from the BARD module 624 are written to the mbNeighCtxCurrent array element 601 of the mbNeighCtx memory 610. The left pointer 607b points to an element of memory 610 which is identical (i.e., a copy) of the memory of an adjacent (adjacent to mbNeighCtx 601) array element (i.e., mbNeighCtx[i−1]).

In view of the above description regarding obtaining a context and model information, the following section describes the BARD module 624 and arithmetic decoding based on the context and model information. The BARD module 624 operates under the BARD instruction, an exemplary format of which is provided below as follows:

BARD DST, SRC2, SRC1, which provides a binary arithmetic decoding operation wherein each bin decoding iteration results in a single bit output. The input parameters are as follows:

SRC1=binIdx/ctxIdx, which is an output of the GCTX module 622; and

SRC2=bypassFlag, which is an output of the BIND module 620.

When forwarding registers are used, one exemplary format may comprise BARD.F1.F2, where F1 and F2 indicate forwarding registers 666 and 668. If one or both of the corresponding forwarding flags are missing, this indicates which forwarded register is not utilized. Note that the BARD module 624 also receives the RST_Signal, as mentioned above. In particular, the BARD module 624 holds the RST_Signal until the first call to the BARD instruction after receiving the signal. Afterwards, the signal is cleared.

In operation, the BARD module 624 receives the context index (ctxIdx) value and a pointer to the current bit parsing position of the encoded bit stream (binIdx) from the GCTX module 622. The BARD module 624 uses the offset and range values from codlOffset register 608 and codlRange register 606 to keep track of the current interval (offset, offset+range) state of the decoding engine. The BARD module 624 uses the context index value to access the context table (CTX_TABLE), which in turn is used to access the current probability state pStateIdx and MPS values. The pStateIdx is used to read (e.g., from a table, which may be stored remotely or in on-chip memory) an LPS sub-range value, the next MPS value, and the next LPS probability value.

Based on the state of the MPS value, and the next range and probability information, the BARD module 624 calculates the MPS value of the current binary symbol. The BARD module 624 outputs a binary symbol (bit or bin value, e.g., $b_0$, $b_1, \ldots b_n$) to the binstring 616. Then the process is repeated for the same or different context for the next bin, as shown by the feedback connection 658 from the binstring 616 to the GCTX module 622. The BARD module 624 also provides updates to the offset and range values, as well as the probability state for the next bin based on the selection of the MPS value. In addition, the BARD module 624 writes the current MPS and probability state to the context table for use in future contexts.

Note that with regard to the use of forwarding registers 666 and 668, the instructions may or may not have latency if forwarding is signaled. For instance, in forwarding from the BIND module 620 to the GCTX module 622, there is no latency, and the GCTX instruction may be issued in the next cycle. In forwarding from the GCTX module 622 to the BARD module 624, four cycles can be consumed. If the GCTX instruction is issued in cycle j, then the BARD instruction may be issued in cycle (j+5). The absence of useful instructions causes the latency slots to be filled with up to 4 NOPs. In forwarding from the BIND module 620 to the BARD module 624, there is no latency. In forwarding from the BARD module 624 to the GCTX module 622, if the BARD instruction is issued in cycle j, then the GCTX instruction may be issued in cycle (j+5). In forwarding from the BARD module 624 to the BIND module 620, there is no latency if a second binstring is kept and there is switching between them. By keeping the second binstring, it is possible to issue a BARD to BARD instruction for bypass cases without suffering latency.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) without departing substantially from the spirit and principles of the systems and methods. All such modifications and variations are intended to be included herein within the scope of this disclosure and protected by the following claims.

At least the following is claimed:

1. A decoding system, comprising:
a software programmable core graphics processing unit having a context-adaptive binary arithmetic coding (CABAC) unit capable of performing shader functionality, the shader functionality including implementing CABAC decoding of a video stream and providing a decoded data output,
wherein the CABAC decoding is implemented using a combination of software and hardware, wherein the CABAC unit further comprises a binarization (BIND) module configured to receive first information comprising a syntax element and a context block category, and, responsive to execution of a first shader instruction by the BIND module, provide second information corresponding to one or more macroblock parameters based on the first information for use in context modeling.

2. The system of claim 1, wherein the CABAC decoding is accomplished with the context of graphics processing unit programming, with the hardware implementation in a graphics processing unit data path.

3. The system of claim 1, wherein the CABAC unit further comprises a get context (GCTX) module configured to receive the second information, and, responsive to execution of a second shader instruction by the GCTX module, provide a bin and context identifier for use in bin decoding.

4. The system of claim 3, wherein the context identifier corresponds to a most probable symbol (MPS) value or a least probable symbol (LPS) probability.

5. The system of claim 3, wherein the CABAC unit further comprises a binary arithmetic decoding (BARD) module configured to receive the bin and context identifier and an offset and a range, and, responsive to execution of a third shader instruction by the BARD module, decode a binary symbol.

6. The system of claim 5, wherein the CABAC unit further comprises a binstring register configured to receive the decoded binary symbol and provide updated context information.

7. The system of claim 6, wherein the binstring register is configured to receive a plurality of binary symbols representing a decoded syntax element.

8. The system of claim 1, wherein the CABAC unit is further configured to use bits in an instruction to determine whether a result of a previous operation stored in an internal register should be used or a data in a source operand should be used for a current operation at one or more modules.

9. The system of claim 1, wherein the CABAC unit further comprises a direct memory access (DMA) engine module comprising a bitstream buffer and DMA engine, the DMA engine module configured to, responsive to execution of a fourth shader instruction per slice, repeatedly and automatically buffer in the bitstream buffer a predefined quantity of bits as the predefined bits are consumed, the bits corresponding to the video stream.

10. The system of claim 9, wherein the CABAC unit is further configured to stall the DMA engine module responsive to anticipated underflow in the bitstream buffer.

11. The system of claim 9, wherein the DMA engine is further configured to track the number of bits consumed in the bitstream buffer, and responsive to detecting that the number is larger than a predefined quantity, halting the bitstream buffer operation and transferring control to a host processor.

12. The system of claim 1, further comprising a context memory array for context based decoding and corresponding registers, wherein the content memory array comprises elements for a current and a neighboring macroblock, wherein responsive to execution of a fifth shader instruction by a get context (GCTX) module, the GCTX module is configured to write to the context memory array based on Boolean logic operations involving the transfer of values from the registers to the context memory array.

13. A decoding method, comprising:
loading shader functionality to a programmable core graphics processing unit having a context-adaptive binary arithmetic coding (CABAC) unit, the CABAC unit capable of performing the shader functionality;
CABAC decoding a video stream by executing the shader functionality on the CABAC unit;
providing a decoded data output; and
writing to a context memory array used in the CABAC decoding, the writing based on Boolean logic operations involving the transfer of values from registers that serve the context memory to the context memory array.

14. The method of claim 13, wherein the CABAC decoding is accomplished with the context of graphics processing unit programming, with the hardware implementation in a graphics processing unit data path.

15. The method of claim 13, further comprising:
receiving first information comprising a syntax element and a context block category at a binarization (BIND) module; and
responsive to execution of a first shader instruction by the BIND module, providing second information corresponding to one or more macroblock parameters based on the first information for use in context modeling.

16. The method of claim 15, further comprising:
receiving the second information at a get context (GCTX) module; and
responsive to execution of a second shader instruction by the GCTX module, providing a bin and context identifier for use in bin decoding, wherein the context identifier corresponds to a most probable symbol (MPS) value or a least probable symbol (LPS) probability.

17. The method of claim 16, further comprising:
receiving the bin and context identifier and an offset and a range at a binary arithmetic decoding (BARD) module; and
responsive to execution of a third shader instruction by the BARD module, decoding one or more binary symbols.

18. The method of claim 17, further comprising:
receiving the one or more decoded binary symbols at a binstring register, the one or more decoded symbols representing a decoded syntax element; and
providing updated context information.

19. The method of claim 13, further comprising using bits in an instruction to determine whether a result of a previous operation stored in an internal register should be used or a data in a source operand should be used for a current operation at one or more modules.

20. The method of claim 13, further comprising repeatedly and automatically buffering in a bitstream buffer a predefined quantity of bits as the predefined bits are consumed for the decoding, the bits corresponding to the video stream.

21. The method of claim 20, further comprising stalling the buffering responsive to an anticipated underflow in the bitstream buffer.

22. The method of claim 20, further comprising tracking a number of bits consumed in the bitstream buffer, and responsive to detecting that the number is larger than a predefined quantity, halting the bitstream buffer operation and transferring control to a host processor.

* * * * *